United States Patent
Yamada et al.

(10) Patent No.: US 7,018,904 B2
(45) Date of Patent: Mar. 28, 2006

(54) SEMICONDUCTOR CHIP HAVING MULTIPLE FUNCTIONAL BLOCKS INTEGRATED IN A SINGLE CHIP AND METHOD FOR FABRICATING THE SAME

(75) Inventors: Takashi Yamada, Kanagawa-ken (JP);
Hajime Nagano, Kanagawa-ken (JP);
Ichiro Mizushima, Kanagawa-ken (JP);
Tsutomu Sato, Kanagawa-ken (JP);
Hisato Oyamatsu, Kanagawa-ken (JP);
Shinichi Nitta, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/921,273

(22) Filed: Aug. 19, 2004

(65) Prior Publication Data
US 2005/0019999 A1  Jan. 27, 2005

Related U.S. Application Data

(62) Division of application No. 09/995,594, filed on Nov. 29, 2001, now Pat. No. 6,835,981.

(30) Foreign Application Priority Data
Sep. 27, 2001 (JP) .............................. 2001-298533

(51) Int. Cl.
*H01L 21/76* (2006.01)
*H01L 21/20* (2006.01)

(52) U.S. Cl. ........................ 438/404; 438/405; 438/479

(58) Field of Classification Search ................ 438/404, 438/405, 479, 149
See application file for complete search history.

(56) References Cited

U.S. PATENT DOCUMENTS

| | | | | |
|---|---|---|---|---|
| 4,889,829 A | * | 12/1989 | Kawai | 438/405 |
| 4,948,748 A | * | 8/1990 | Kitahara et al. | 438/405 |
| 5,387,537 A | * | 2/1995 | Borel | 438/413 |
| 5,399,507 A | * | 3/1995 | Sun | 438/152 |
| 5,740,099 A | * | 4/1998 | Tanigawa | 365/51 |
| 5,894,152 A | | 4/1999 | Jaso et al. | |

(Continued)

FOREIGN PATENT DOCUMENTS

JP         7-106434         4/1995

(Continued)

OTHER PUBLICATIONS

M. Sato, et al., 2000 Symposium on VLSI Technology Digest of Technical Papers, pp. 82-83, "Transistor on Capacitor (TOC) Cell With Quarter Pitch Layout For 0.13 μm DRAMS and Beyond", Jun. 13, 2000.

(Continued)

*Primary Examiner*—Matthew Smith
*Assistant Examiner*—Lex H. Malsawma
(74) *Attorney, Agent, or Firm*—Oblon, Spivak, McClelland, Maier & Neustadt, P.C.

(57) ABSTRACT

A semiconductor chip comprises a base substrate, a bulk device region having a bulk growth layer on a part of the base substrate, an SOI device region having a buried insulator on the base substrate and a silicon layer on the buried insulator, and a boundary layer located at the boundary between the bulk device region and the SOI device region. The bulk device region has a first device-fabrication surface in which a bulk device is positioned on the bulk growth layer. The SOI device region has a second device-fabrication surface in which an SOI device is positioned on the silicon layer. The first and second device-fabrication surfaces are positioned at a substantially uniform level.

13 Claims, 19 Drawing Sheets

U.S. PATENT DOCUMENTS

| | | |
|---|---|---|
| 6,180,486 B1 | 1/2001 | Leobandung et al. |
| 6,214,653 B1 | 4/2001 | Chen et al. |
| 6,214,694 B1 * | 4/2001 | Leobandung et al. ....... 438/413 |
| 6,232,649 B1 * | 5/2001 | Lee ............................ 257/588 |
| 6,333,532 B1 | 12/2001 | Davari et al. |
| 6,350,653 B1 | 2/2002 | Adkisson et al. |
| 6,404,014 B1 * | 6/2002 | Leobandung et al. ....... 257/347 |
| 6,555,891 B1 * | 4/2003 | Furukawa et al. .......... 257/505 |
| 6,635,550 B1 * | 10/2003 | Houston ..................... 438/406 |

FOREIGN PATENT DOCUMENTS

| | | |
|---|---|---|
| JP | 8-17694 | 1/1996 |
| JP | 8-316431 | 11/1996 |
| JP | 10-303385 | 11/1998 |
| JP | 11-17001 | 1/1999 |
| JP | 11-238860 | 8/1999 |
| JP | 2000-91534 | 3/2000 |
| JP | 2000-243944 | 9/2000 |
| JP | 2000-269460 | 9/2000 |
| JP | 2001-196556 | 7/2001 |
| KR | 10-0210626 | 7/1999 |
| KR | 2001-0003206 | 1/2001 |

OTHER PUBLICATIONS

Robert Hannon, et al., 2000 Symposium on VLSI Technology Digest of Technical Papers, pp. 66-67, "0.25 μm Merged Bulk DRAM and SOI Logic Using Patterned SOI", Jun. 13, 2000.

* cited by examiner

BULK DEVICE REGION (DRAM MACRO) ← → SOI DEVICE REGION (SOI LOGIC)

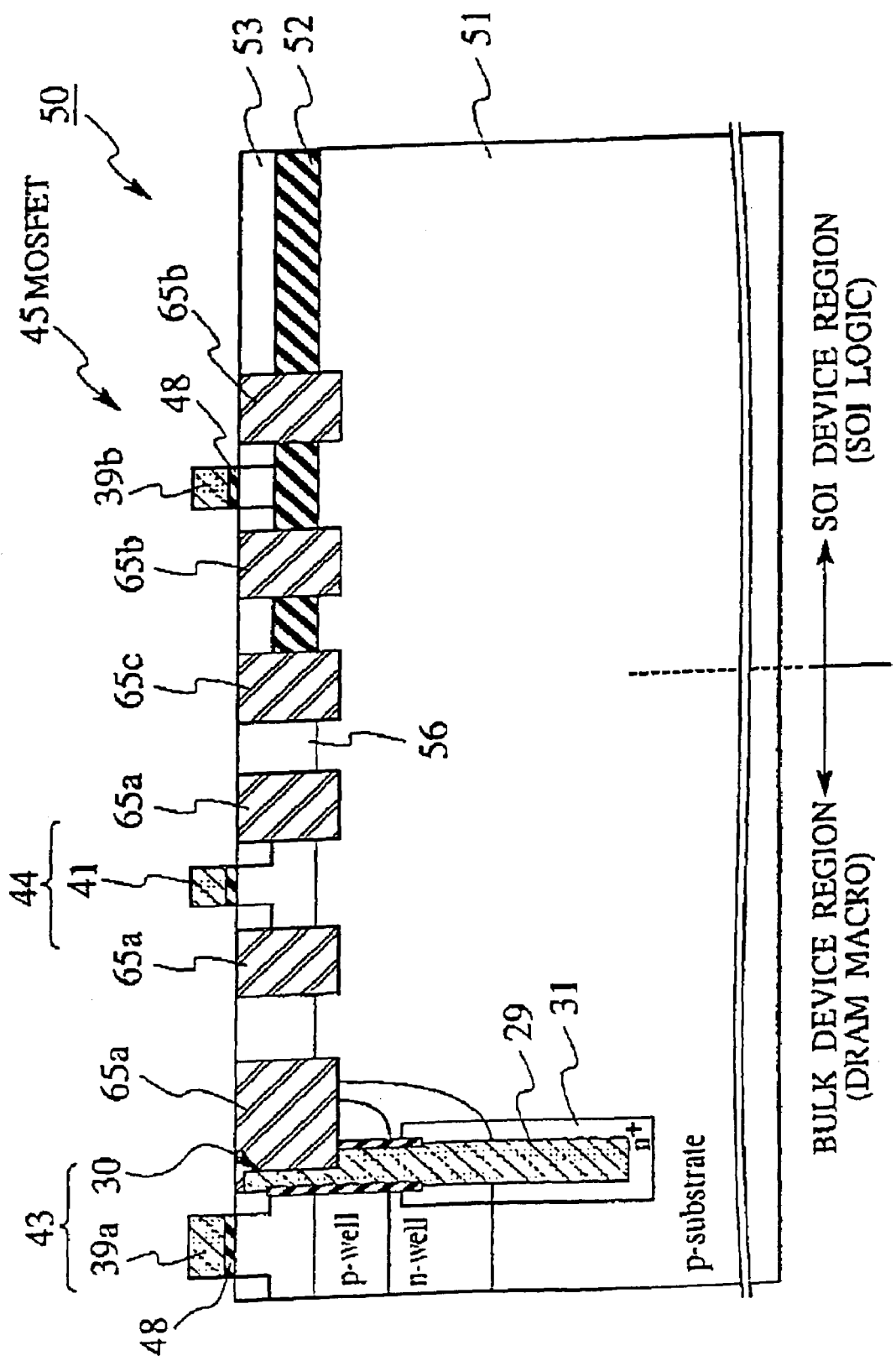

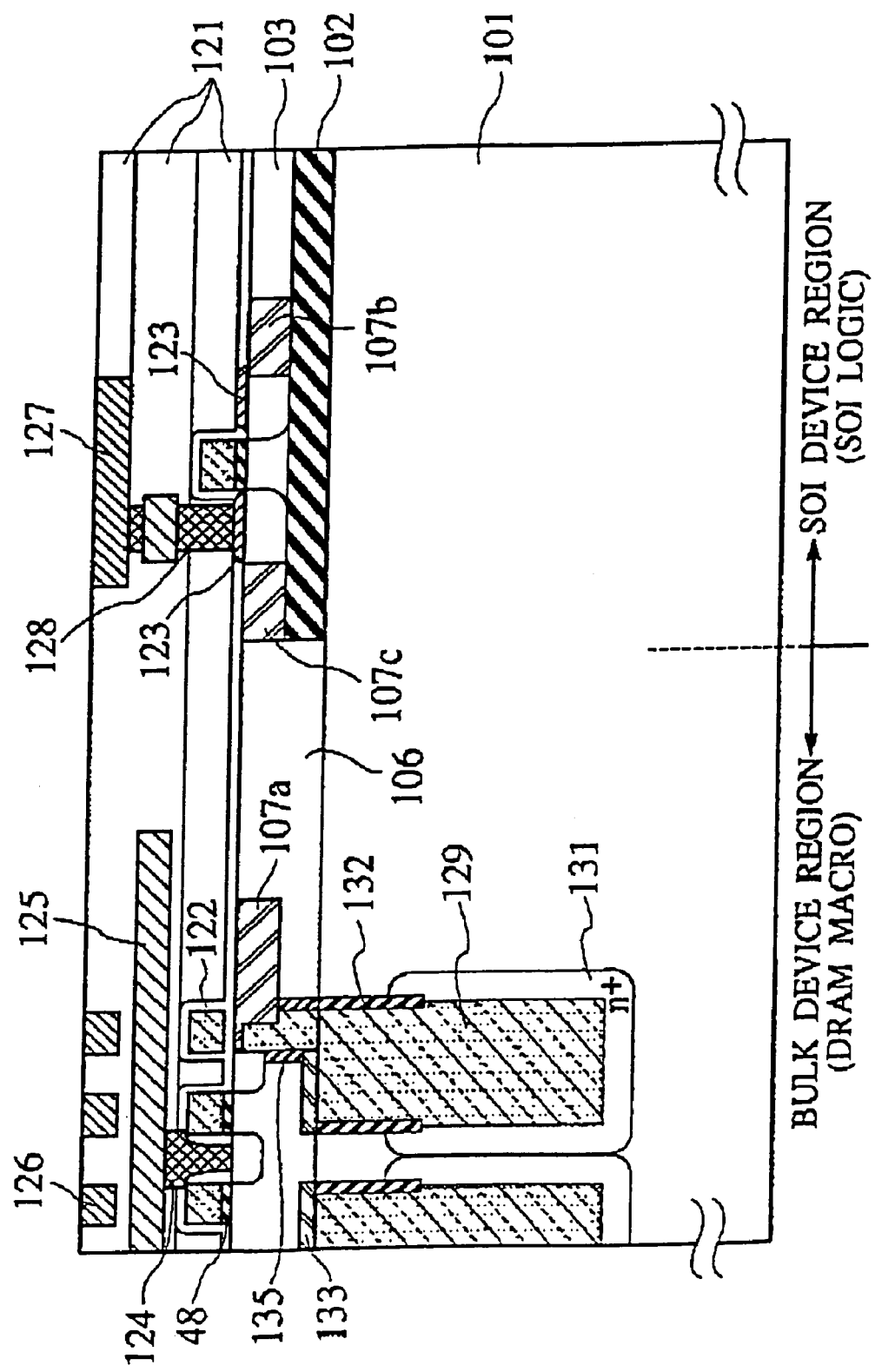

SEMICONDUCTOR CHIP HAVING MULTIPLE FUNCTIONAL BLOCKS INTEGRATED IN A SINGLE CHIP AND METHOD FOR FABRICATING THE SAME

This application is a division of and claims the benefit of priority under 35 U.S.C. §120 from U.S. Ser. No. 09/995,594, filed Nov. 29, 2001 filed Nov. 29, 2001, U.S. Pat. No. 09/995,594, and under 35 U.S.C. §119 from Japanese Patent Application No. 2001-298533, filed Sep. 27, 2001, the entire contents of each of which are incorporated herein by reference.

BACKGROUND OF THE INVENTION

1. Field of the Invention

This invention relates to a semiconductor chip having a functional block positioned in an SOI (silicon-on-insulator) region and another functional block positioned in a bulk region in a single chip and a method for fabricating such a semiconductor chip.

2. Description of Related Art

DRAM chips having a 1T1C (1-transistor-1-capacitor) memory cell structure have been widely used us an inexpensive and large-capacity memory suitable for high-density integrated circuits. In recent years, demand has been increasing for a system LSI, in which a DRAM and a logic core are integrated in a single chip in order to improve system performance, On the other hand, SOI devices, such as a SOIMOSFET, using an SOI substrate in place of a conventional silicon bulk substrate has been attracting a great deal of attention. In SOI devices, transistors are formed in the silicon layer positioned on the buried oxide (referred to as "SOI layer") in an SOI substrate. Such SOT devices have already been mass-produced for use in high-performance logic circuit. Along with this trend, in order to further bring out the advantages of a high-performance logic circuit consisting of SOI devices (hereinafter referred to as an "SOI logic"), development of a system LSI or a system-on-chip which carries a memory (e.g., a DRAM) together with an SOI logic on a single chip has become an argent necessity.

However, it is difficult to form a DRAM in an SOI substrate, employing the same structure with the high-performance logic devices (e.g., SOIMOSFETs), for several reasons.

First, leakage current or fluctuation of the threshold voltage will occur during operation because electric potential of the substrate (i.e., the body region) of the SOIMOSFET is floating. If such an SOIMOSFET is used as a path-transistor, leakage current (e.g., a parasitic MOSFET current or a parasitic bipolar-current) occurs depending on the operational conditions of the source/drain voltage, even if the gaze voltage is in the OFF condition. For this reason, from a viewpoint of retention, the SOIMOSFET structure is unsuitable for DRAM cell transistors having a strict leakage-current spec.

Second, the threshold voltage varies in accordance with changes in the operational conditions, including operation hysteresis, due to the floating body effect. Accordingly, if the sense amplifier of the DRAM is comprised of SOIMOSFETs, variation in the threshold voltage between the pair transistors is amplified, and the sense margin deteriorates.

To solve the problem of the floating body effect, a technique for fixing the body potential by providing a contact to the additional device region extracted from the body of the conventional MOSFET pattern was proposed. However, this method increases the occupied area of both the memory cell and the sense amplifier greatly, and spoils the high integration feature, which is the main characteristic of a DRAM.

Then it is proposed to form a bulk substrate region as a portion of an SOI substrate, and to form circuits, such as DRAMs, which are incompatible with the floating body effect, in the bulk substrate region. In fact, various methods for fabricating a substrate having both a bulk structure and an SOI structure (referred to as an "SOI/bulk substrate") have been proposed.

A first approach is a SIMOX (separation by implanted oxygen) technique using a mask pattern (Japanese Patent Application Laid-open (Kokai) No. 10-303385, and Robert Hannon, et al. 2000 Symposium on VLSI Technology Of Technical Papers, p66–67). With this method, oxygen is implanted in predetermined positions in the silicon bulk substrate to produce an SOI structure that coexists with the silicon bulk regions.

A second approach is a wafer bonding technique for bonding a silicon substrate onto another silicon substrate with a patterned insulator (Japanese Patent Application Laid-open (Kokai) No. 8-316431).

A third approach is to etch the SOI layer and the buried oxide at a predetermined position of the SOI substrate to partially expose the base substrate, thereby producing a bulk region in the SOI substrate (Japanese Patent Application Laid-open (Kokai) Nos. 7-106434, 11-238860, and 2000-91534).

A fourth approach is to form an epitaxially grown silicon layer on the base substrate in order to eliminate the level difference between the SOI substrate region and the bulk region resulting from the partial etching in the third approach (Japanese Patent Application Laid-open (Kokai) No. 2000-243944). In this method, the epilaxial layer is grown until it exceeds the mask layer placed over the SOI substrate region, and then it is planarized using the mask layer as a stopper.

There are problems with these approaches to forming an SOI/bulk substrate.

The first approach deteriorates the crystalline characteristic of the SOI layer due to the implantation of oxygen ions. In addition, volume expansion that occurs when the buried oxide is formed led by reaction between silicon and the implanted oxygen in a thermal process causes stress, and crystal defect is produced at the boundary between the SOI substrate region and the bulk region.

The second approach produces an undesirable interface state and a crystal-defect layer, which deteriorate both the crystal characteristic and the electrical characteristic bonding surface between the two substrates. Such an interface state and crystal defect are due to contamination and shifting of crystal orientation.

The third approach causes a level difference between the SOI substrate region and the bulk region by an amount corresponding to the thickness of the SOI layer and the buried oxide. This level difference makes it difficult to guarantee the focusing margin in the photolithography process, and to control the height of the buried insulator in the trench when forming isolations.

In the fourth approach, the crystal line characteristic of the epitaxial growth layer may deteriorate near the interface between the bulk region and the SOI substrate region. This problem is caused by the fact that crystal grows from both the top face of the base substrate and the sidewall of the SOI layer during the formation of the bulk growth layer. The crystal characteristic of the epitaxial layer having grown from the etched side face of the SOI substrate is inherently bad. In addition, the crystal orientations of the epitaxial layers having grown from the lop surface of the base substrate and from the sidewalls of the SOI layer are mismatched with each other at the interface between them, further deteriorating the crystal characteristic.

Then, it is conceived to cover the exposed sidewall of the SOI layer with a protection film, such as silicon nitride film, before forming the epitaxial growth layer in order to solve the above-described problem, However, if a sidewall protection film (e.g., $Si_3N_4$) exists at the boundary between the epitaxially grown bulk region and the SOI substrate region, a relatively large stress is produced in both the epitaxial growth layer and the SOI layer over several micrometers near the boundary, depending on the process conditions. Such stress may cause change in the mobility of the carriers and crystal defect. If a transistor is positioned in an area having crystal defect, the device characteristic becomes inferior.

Furthermore, because the epitaxial growth layer is polished using the mask layer as a stopper, the final level of the epitaxial growth layer close to the boundary in the bulk region becomes higher than the SOL layer of the SOI substrate region equivalent to the thickness of the mask layer. To avoid the surface unevenness, a troublesome after-treatment, for example, re-polishing the epitaxial growth layer after thinning the mask layer, must be carried out If the epitaxial growth layer is set broad in order to form a DRAM macro in it, dishing, which is a phenomenon where a center portion of the layer sinks, occurs. The unevenness of the top surface remains as a step or a level difference in the subsequent processes, and adversely affects the manufacturing process.

Therefore, a novel and improved approach to solving these problems in the conventional methods is desired.

SUMMARY OF THE INVENTION

In one aspect of the invention, a semiconductor chip comprises a base substrate, a bulk device region located on a part of The base substrate and having a bulk growth layer, an SOI device region located on the other part of the base substrate and having a buried insulator and a silicon layer located on the buried insulator, and a boundary layer located between the bulk device region and the SOI device region. The bulk device region has a first device-fabrication surface in which a bulk device is fabricated, and the SOI device region has a second device-fabrication surface in which an SOI device is fabricated. The first and second device-fabrication surfaces are positioned at substantially the same level.

In another aspect of the invention, a method for fabricating a semiconductor chip comprises (a) preparing an SOI substrate consisting of a base substrate, a buried insulator on the base substrate, and a silicon layer on the buried insulator, (b) removing a portion of the silicon layer and the buried insulator at a predetermined region of the SOI substrate, (c) forming a sidewall protection film covering the side face of the silicon layer exposed by the removal (d) exposing the base substrate at said predetermined region, and forming a bulk growth layer on the base substrate so as to be in alignment with the top face of the silicon layer, (c) forming isolations in the bulk growth layer and the SOI substrate, the isolations having the same depth and (f) forming devices in the bulk growth layer and the SOI substrate.

In still another aspect of the invention, a method for fabricating a semiconductor chip comprises (a) preparing an SOI substrate consisting of a base substrate, a buried insulator on the base substrate, and a silicon layer on the buried insulator, (b) removing a portion of the silicon layer at a first position on the SOI substrate and forming a first isolation in the removed portion, (c) exposing The base substrate at a second position, while keeping a side face of the silicon layer covered with the first isolation, (d) forming a bulk growth layer from the exposed base substrate so as to be in alignment with the top face of the silicon layer, (e) forming a second isolation in the bulk growth layer, the second isolating being deeper than the first isolation, and (F) forming devices in the bulk growth layer and the SOI substrate In yet another aspect of the invention, a method for fabricating a semiconductor chip comprises (a) preparing an SOI substrate consisting of a base substrate, a buried insulator on the base substrate, and a silicon layer on the buried insulator, (b) removing a portion of the silicon layer and the buried insulator at a predetermined region on the SOI substrate to expose the base substrate, (c) forming a first part of a trench capacitor having a first width in the exposed base substrate, (d) forming a bulk growth layer from the base substrate so as to be in alignment with the top face of the silicon layer, and (e) forming a second pars of the trench capacitor having a second width in the bulk growth layer, the second width being smaller than the first width.

In yet another aspect of the invention, a method for fabricating a semiconductor chip comprises (a) preparing an SOI substrate consisting of a base substrate a buried insulator on the base substrate, and a silicon layer on the buried insulator, (b) removing a portion of the silicon layer and the buried insulator at a predetermined region on the SOI substrate to expose the base substrate, (c) forming a bulk growth layer from the exposed base substrate so as to be in alignment with the top face of the silicon layer, (d) forming a dummy pattern layer in the bulk growth layer near the boundary between the bulk growth layer and the SOI substrate, the dummy pattern layer being deeper than the buried insulator of the SOI substrate, and (e) forming devices in the bulk growth layer and the SOI substrate.

BRIEF DESCRIPTION OF THE DRAWINGS

FIG. 4 is a schematic cross-sectional view of the semiconductor chip according to the second embodiment of the invention

FIG. 12 illustrates a modification of the semiconductor chip shown in FIG. 10.

DETAILED DESCRIPTION OF THE INVENTION

FIG. 1 illustrates examples of the plan layout of a semiconductor chip 10, to which the present invention is applied. The semiconductor chip 10 has a bulk device region 11, in which circuit elements are positioned in the bulk substrate domain, and an SOI device region 12, in which circuit elements are positioned in the SOI substrate domain. The semiconductor chip 10 is a so-called system-on-chip having multiple functional blocks in a single chip.

in the SOI device region 12, transistors are formed in the silicon layer (i.e., the SOI layer) located on the buried insulator. The SOI device region 12 is suitable for fabricating circuit elements that require high-speed operations with low power consumption because the insulator exists directly below the active layer, thereby reducing the junction capacitance. Examples of such a high-speed circuit element include a logic device. On the other hand, the bulk device region 11 is suitable for fabricating Those devices that require a bulk structure in order to avoiding the floating body effect and the associated problems. Examples of such devices include a DRAM cell and a sense amplifier.

Figure 1A:
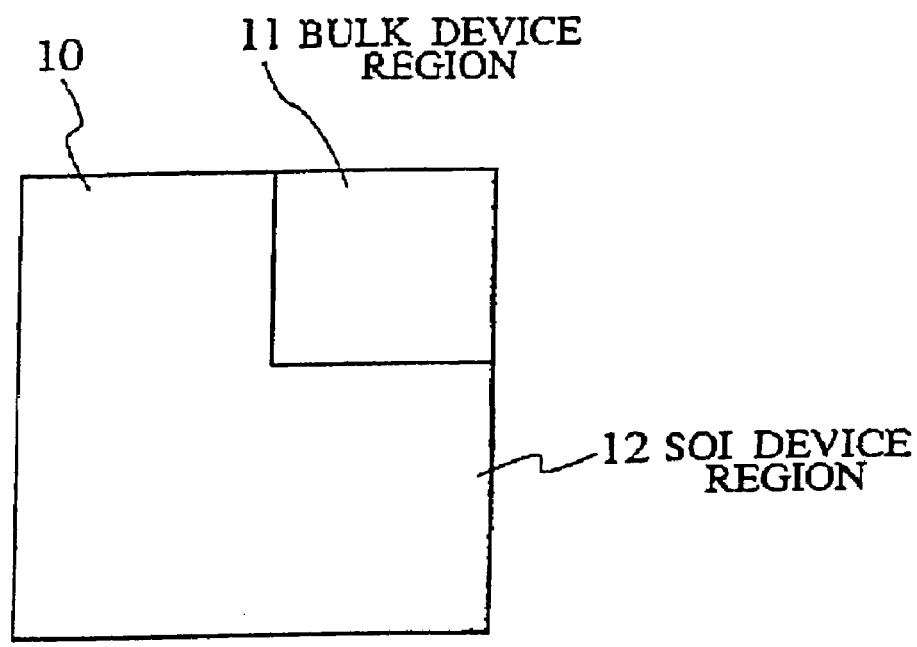
FIG. 1 illustrates examples of the plan layout of a semiconductor chip, to which the present invention is applied.
Figure 1B:
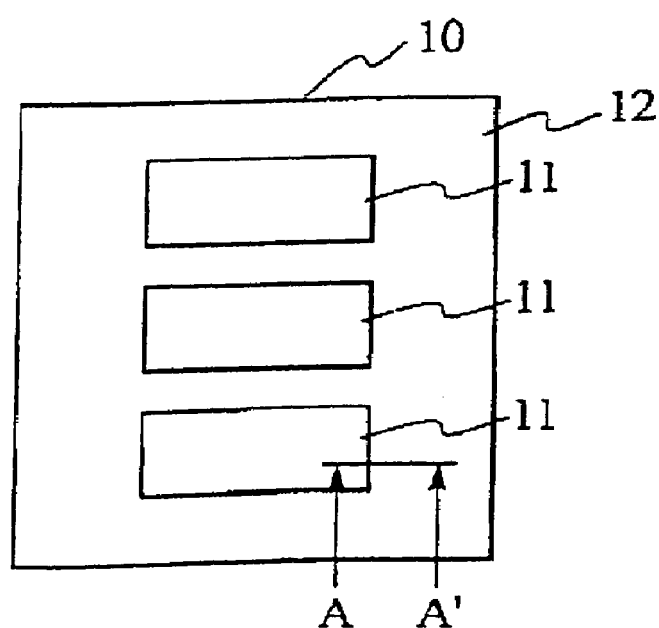

FIG. 1A illustrates an example where a single bulk device region 11 is arranged in the semiconductor chip 10, and FIG. 1B illustrates an example where multiple bulk device regions 11 are arranged in the semiconductor chip 10 If DRAM cells art provided as the circuit elements of the bulk device region 11, not only a DRAM army, but also the peripheral circuits (e.g., a sense amplifier, a power source circuit, a decode circuit, an I/O circuit, and combinations thereof) are arranged within the bulk device region 11 to form a functional block as a whole. The functional block including the DRAM and the associated circuits is referred to as a "DRAM macro". If MOS transistors are formed in the SOI layer in the SOI device region 12, a high-speed logic circuit is constituted. This logic circuit is referred to as "SOI logic".

In order to realize the system-on-chip shown in FIG. 1, a so-called SOI/bulk substrate is required. SOI/bulk substrate has an SOI region and a bulk region on the same base substrate. The conventional methods for fabricating an SOI/bulk substrate involve various problems, as have been described above.

To avoid the influence of stress on the devices, an adequate margin space must be guaranteed between the epitaxial bulk region and the SOI substrate region. In such a case, the margin space, in which devices cannot be formed, is dead space, and consequently, the chip size becomes large. Meanwhile, it is desirable to eliminate the level difference between the epitaxial bulk region and the SOI substrate region, and to form Circuit elements at a uniform level in both regions, Therefore, improved semiconductor chips and the fabricating methods are provided, which can eliminate the stress between the bulk region and the SOI substrate region without increasing chip size, and which allow the circuit elements to be positioned at a uniform level. In the following, various embodiments will be described using an example of mounting a DRAM macro and an SOI logic on a single chip.

<First Embodiment>

Figure 2:
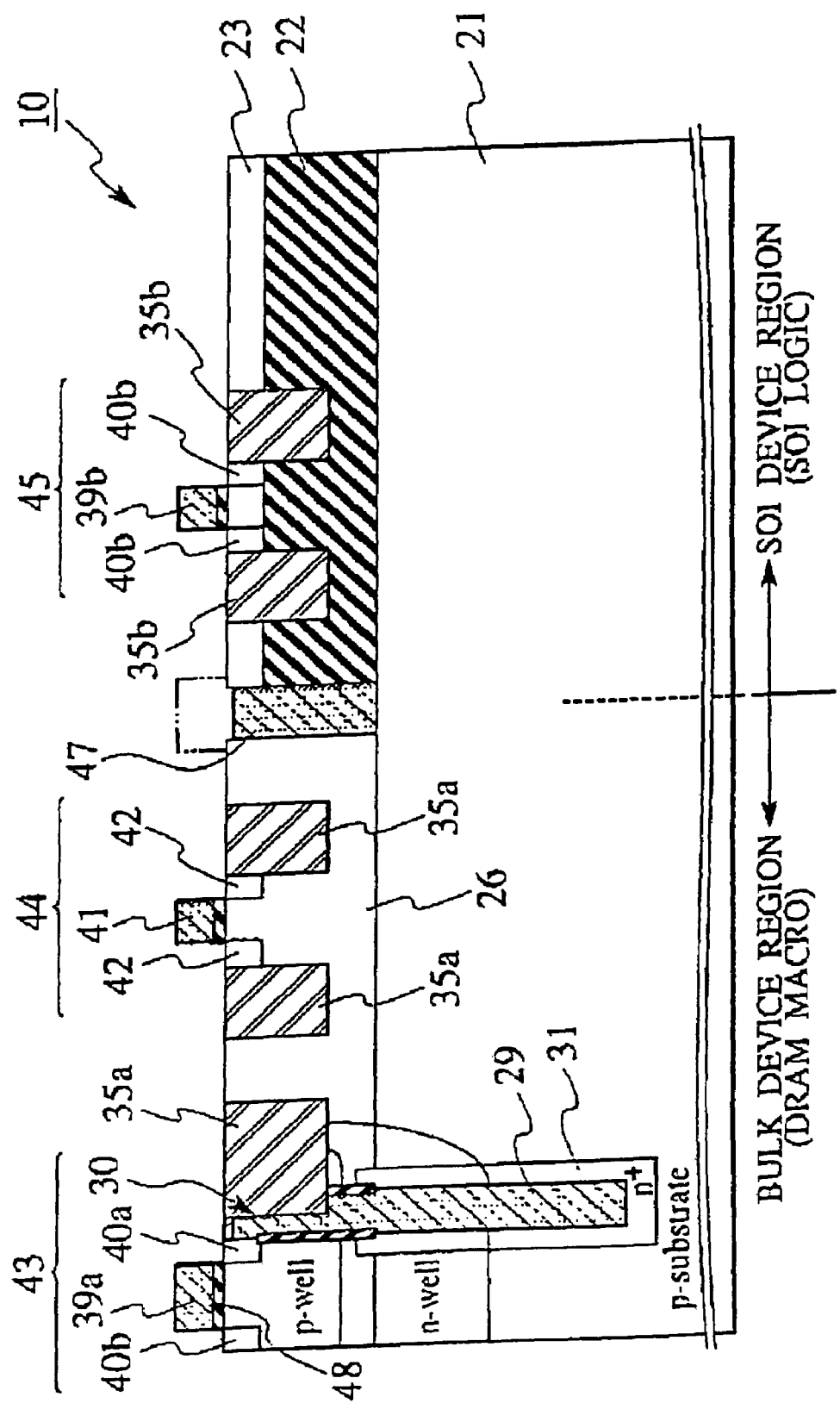
FIG. 2 is a schematic cross-sectional view of the Semiconductor chip according to the first embodiment of the invention FIGS. 3A though 3G illustrate a fabrication process of the semiconductor chip shown in FIG. 2.

FIG. 2 illustrates a semiconductor chip 10 according to the first embodiment of the invention. The semiconductor chip 10 is depicted in a cross-sectional view taken along the A–A' line shown in FIG. 1B. The semiconductor chip 10 includes a base substrate 21, a bulk device region 11 located on a part of the base substrate 21, an SOI device region 12 located on the other part of the base substrate 21, and a polysilicon layer 47 located at the boundary between the bulk device region 11 and the SOI device region 12. The bulk device region 11 has a bulk growth layer 26 positioned on the base substrate 21, in which devices are fabricated. The SOI device region 12 has a buried oxide 22 positioned on the base substrate 21, and a silicon (SOI) layer 23 located on the buried oxide 22 in which devices are fabricated. In the example shown in FIG. 2, the bulk growth layer 26 is an epitaxially grown single crystal silicon layer, and the base substrate 21 is, for example, a p-Type silicon base.

The bulk device region 11 includes a DRAM cell 43 with a trench capacitor 30, and a MOSFET transistor 44 for necessary peripheral circuits (not shown). These devices and circuits as a whole constitute a DRAM macro as a functional block.

The SOI device region 12 includes an SOIMOSFET 45, which constitutes SOI logic.

The top face of the epitaxial growth layer 26, in which the DRAM cell 43 and the peripheral MOSFET 44 are fabricated, substantially aligns with the top face of the SOI layer 23, in which the SOIMOSFET 45 is fabricated Accordingly, the devices or the circuit elements located in the bulk device region 11 and those in the SOI device region 12 are positioned at substantially the same level.

The DRAM cell 43, the peripheral MOSFET 44, and the SOIMOSFET 45 have gate electrodes 39a, 41, and 39b, respectively, which are made of, for example, polysilicon. The boundary layer 47 between the bulk device region 11 and the SOI device region 12 is polysilicon layer in the example shown in FIG. 2; however, it may be made of other silicon group materials, such as amorphous silicon or silicon germanium (SiGe). In order to reduce the number of fabrication steps, it is preferable to use a gate material for the devices 43, 44, and 45 as the boundary layer 47. In this case, the boundary layer 47 can be provided via a gate dielectric film.

The top face of the polysilicon boundary layer 47 slightly retreats from the epitaxial growth layer 26 and the SOI layer 23 in tile example of FIG. 2. However, the boundary layer 47 may project from the surface of the epitaxial growth layer 26 and the SOI layer 23 up to the height of the gate 39a, 39b, and 41 of the devices 43, 45, and 44, as indicated by the ghost line in FIG. 2. The gate electrodes 39a, 39b, and 41 may further have a silicide deposited on the polysilicon.

The semiconductor chip 10 also has first isolations 35a isolating the devices 43 and 44 in the bulk device region 11, in which the DRAM macro is formed, and second isolations 35b isolating the devices 45 in the SOI device region 12, in which the SOI logic is formed. The first isolation 35a in the bulk device region 11 and the second isolation 35b in the SOI device region 12 are almost the same depth. To reduce the number of fabrication steps, it is desirable that the first and second isolations 35a and 35b are formed at the same time.

In the example show in FIG. 2, the thickness of the buried oxide 22 is relatively large, and the second isolation 35b reaches to halfway through the buried oxide 22. However, if the buried oxide 22 is not as thick, the second isolation 35b may reach through to the silicon base substrate 21 as long as it is substantially as deep as the first isolation 35a, penetrating the SOI layer 23. By setting the second isolation 35b to be as deep as the first isolation 35a, the effective distance between two adjacent devices 45 located in the SOI layer 23 with the second isolation 35b between them is lengthened. In this case, the effective distance is the length from the MOSFET 45 to the adjacent MOSFET 45 (not shown) along the contour of the second isolation 35b. This arrangement can realize miniatured isolation with little leakage current from the interface of the damaged buried oxide 22, and prevent deterioration of the endurance of the second isolation 35b due to the current leakage. If the first and second insulators are of the same depth and made of the same material, they can be fabricated at once with a sufficient margin under the same condition.

FIGS. 3A through 3G illustrate a fabrication process of the semiconductor chip 10 shown in FIG. 2.

Figure 3A:
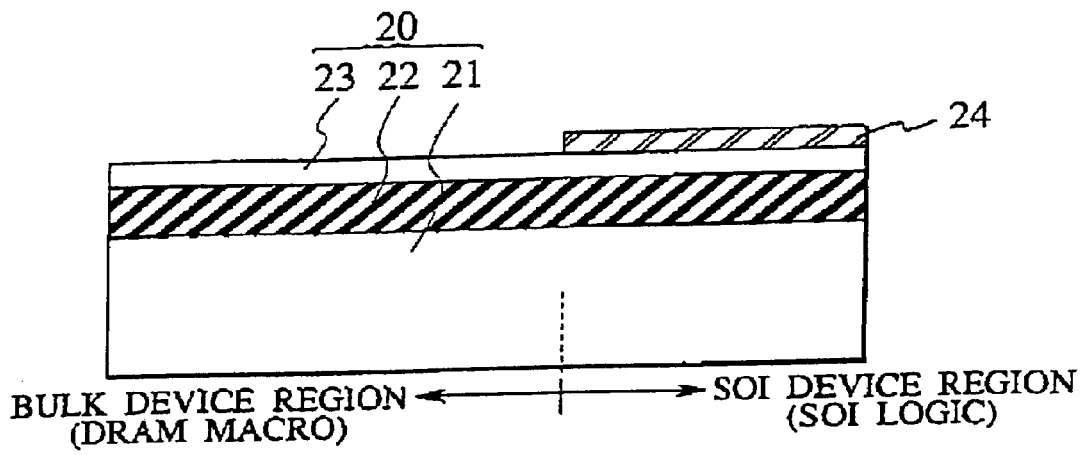

(a) First, as shown in FIG. 3A, an SOI wafer 20 consisting of a silicon base substrate 21, a buried oxide 22, and an SOI layer 23 is prepared, and mask pattern 24 is formed on the SOI layer 23. The mask pattern 24 is formed of silicon dioxide ($SiO_2$), silicon nitride (SiN, $Si_3N_4$, etc.), or a composite layer of these materials.

Figure 3B:
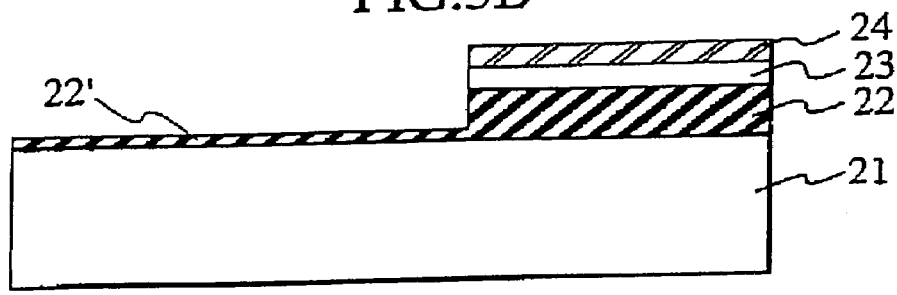

(b) Then, as shown in FIG. 3B, portions of the SOI layer 23 find the buried oxide 22 that are not covered by the mask pattern 24 are removed by anisotropic etching, such as RIE (Reactive ion etching). The etching is terminated so that a thin buried oxide 22' is left on the base substrate 21, for the purpose of preventing mechanical damage or plasma damage to the silicon base substrate 21.

Figure 3C:
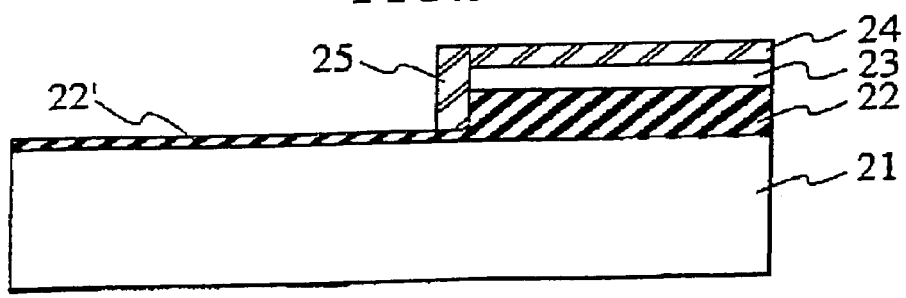

(c) Then, as shown in FIG. 3C, a sidewall protection film 25 is formed in order to cover the exposed side face of the SOI layer 23. The sidewall protection film 25 is, for example, silicon nitride ($Si_3N_4$) or silicon dioxide ($SiO_2$). After such a material is deposited over the entire surface, only the sidewall protection film 25 is left by RIE. The thickness of the sidewall protection film 25, as well as that of the buried oxide 22 to be removed, are controlled so that the remaining buried oxide 22' is maintained on the base substrate 21 during the formation of the sidewall protection film 24.

Figure 3D:
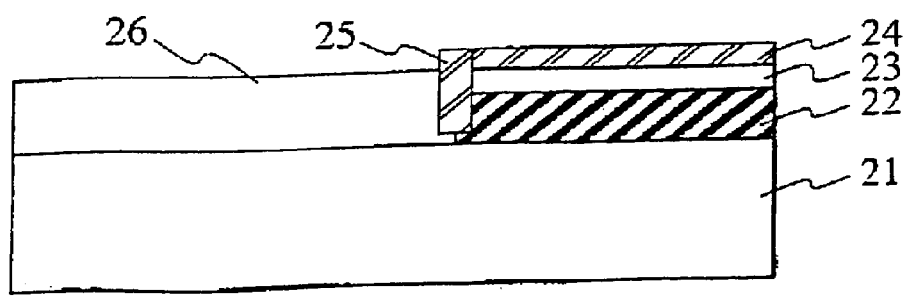

(d) Then, as shown in FIG. 3D, the remaining buried oxide 22' is removed by wet etching using an etchant, such as $NH_4F$ or HF, to expose the silicon base substrate 21 without damage. Then, after a predetermined pretreatment, a single crystal silicon layer 26 is formed on the exposed silicon base substrate 21 by selective epitaxial growth (e.g., chemical vapor deosition).

If the sidewall protection film 25 is made of silicon dioxide ($SiO_2$) in the previous step, the sidewall protection film 25 may also be slightly etched when removing the remaining buried oxide 22' by wet etching, However, by sufficiently reducing the thickness of the remaining buried oxide 22' in the step shown in FIG. 3B, silicon bass substrate 21 is exposed without revealing the side face of the SOI layer 23.

If the sidewall protection film 25 is made of silicon nitride ($Si_3N_4$) in the previous step, process controllability is improved. In the first embodiment, the sidewall protection film 25 is to be removed in a later step. Accordingly, even if the sidewall protection film 25 is made of $Si_3N_4$, it will not cause serious stress near the boundary in the final product, and priority can be given to process controllability.

Figure 3E:
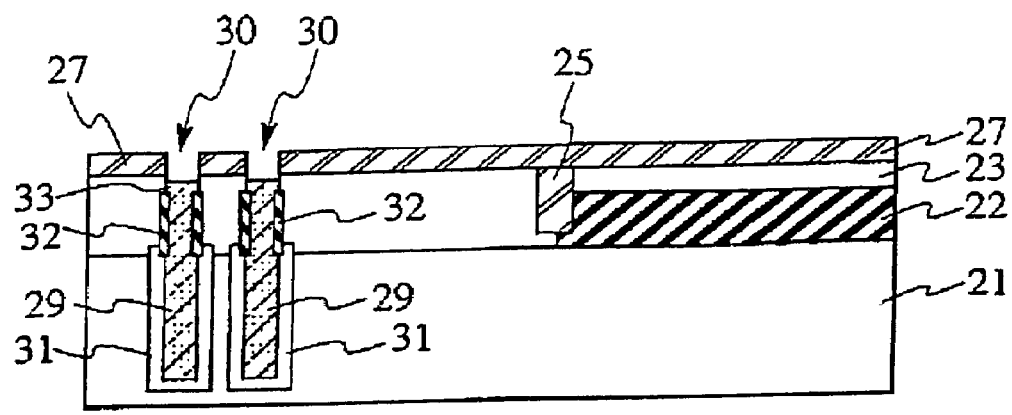

(c) Then, as shown in FIG. 3E, the mask pattern 24 remaining on the SOI layer 23 is removed, and a mask layer 27 is newly formed over the entire surface. If the former mask pattern 24 is made of $Si_3N_4$, it can be removed using phosphoric acid. If the former mask pattern 24 is made of $SiO_2$, it can be removed by hydrogen fluoride (F).

The sidewall protection film 25 can also be etched depending on the material; however, the etched portion is to be filled with the new mask layer 27, which is also made of $SiO_2$, $Si_3N_4$, or a composite layer of these materials. The mask layer 27 is patterned, and the DRAM trench capacitor 30 is formed using the mask pattern 27 using a technique desired. For example, a trench is formed by RIE or other suitable methods, a lower diffusion plate electrode 31 is formed, and the trench is filled with, for example, n-type polysilicon via a dielectric film (not shown) to form a storage electrode 29. A collar oxide 32 is formed, and the trench is further filled with polysilicon. A strap 33 is formed for electrically connecting the electrode 29 to the n-source/drain 40a (FIG. 2) of The cell transistor, and the trench is finally filled with, for example, n-type polysilicon.

Figure 3F:
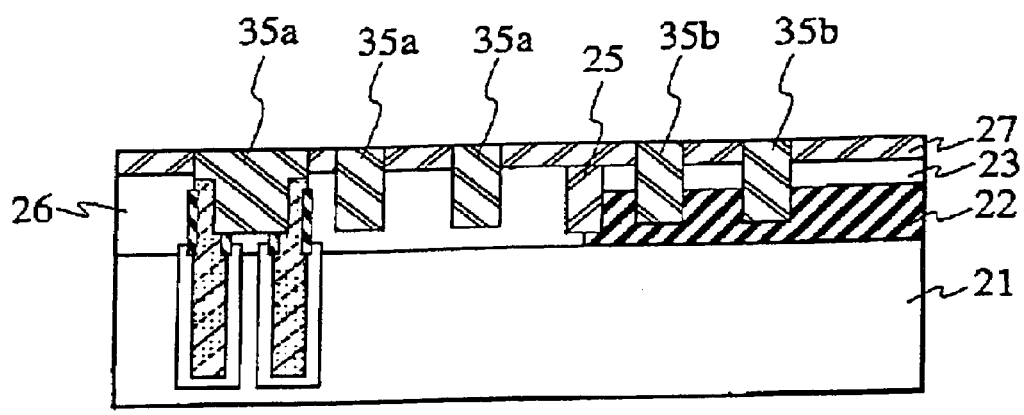

(f) Then, as shown in FIG. 3F, isolations 35a and 35b are formed in the bulk device region 11 and the SOI device region 12 collectively. To be more precise, the mask layer 27 is patterned, and trenches with the same depth are formed for isolation in both the bulk device region 11 and the SOI device region 12. These trenches are filled with an insulator using the masks 27 as stoppers. In this manner, the first isolations 35a in the bulk device legion 11 and the second isolations 35b in the SOI device legion 12 are formed at the same time.

If an etching condition that silicon and silicon dioxide are etched at the same etching rate is set, the trenches for the first and second isolations in the bulk device region 11 and the SOI device region 12 can be dug at the same rate until the trenches reach the depth necessary to make the isolations between the straps 33 of the DRAM cells, between transistors of the peripheral circuit, and between the SOI devices. The trenches are then filled with the same dielectric material, thereby completing the first and second isolations 35a and 35b.

Figure 3G:
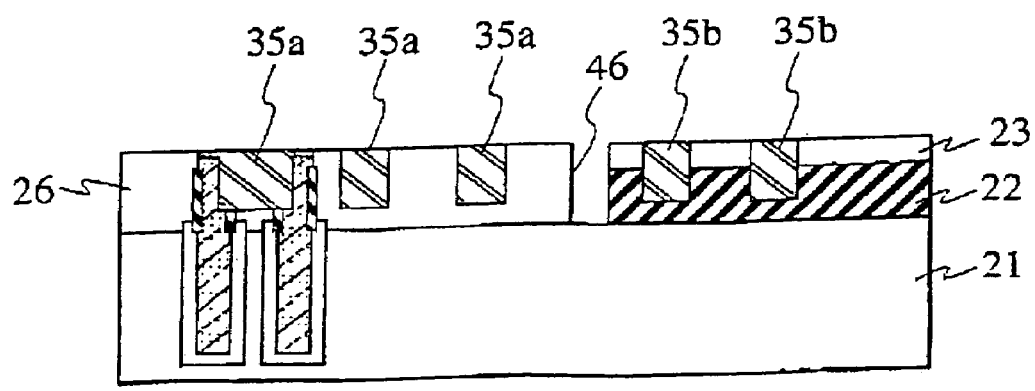

(g) Finally, as shown in FIG. 3G, the buried insulator in the trench is etched back approximately to the Top faces of the SOI layer 23 and the epitaxial growth layer 26. The mask layer 27 is also removed Even in case that the sidewall protection film 25 remains, it is removed during the removal of the mask layer 27 and in an additional etching process carried out if necessary, and a recess 46 is formed. Then, the recess 46 is filled with a silicon group material to produce the boundary layer 47 shown in FIG. 2. Filling the recess 46 may be carried out as an independent step, or alternatively, the recess 46 may be filled up when gate electrodes 39, 41 are formed. In the former case, wells and channels are formed, if necessary, using an ion implantation technique after the recess 46 is tilled. Gate electrodes 39, 41 are formed via the gate dielectrics 48, and source and drains 40 and 42 are formed. In the latter case, the gate electrodes 39, 41 are made of a silicon group material, such as polysilicon or SiGe, and the recess 46 is automatically filled with the gate material when forming the gate electrodes. In either case, the SOI layer 23 is coupled with the single crystal silicon epitaxial growth layer 26 via the same silicon group material between them.

After the gate electrodes 39, 41 are fabricated, interlevel dielectrics and interconnections are formed according to a desired MOSFET fabrication process. Thus, a semiconductor chip having a DRAM macro and an SOI logic core in a single chip is fabricated. If a salicide is provided over the gate electrodes and sources and drains when forming transistor, it is preferable to protect the boundary with a mask in the structure shown in FIG. 2 in order to prevent deformation of the polysilicon layer 47. If the polysilicon layer 47 projects from the device-fabrication surface overlapping the source and drain, the recess is protected by the polysilicon itself, and therefore, salicide process can be carried out without an additional protection mask.

In the example shown in FIG. 2, the buried oxide 22 is relatively thick, and the interface between the base substrate 21 and the epitaxial growth layer 26 is located deeply. Accordingly, the pn junction of the strap 33 and the source and drain of the DRAM cell 43 can be positioned shallower than the interface between the base substrate 21 and the epitaxial growth layer 26 for the purpose of reliably separating the pn junctions from the interface. This arrangement can prevent junction leakage and maintain the retention characteristic of the memory cell even if the interface state deteriorates due to process conditions.

Since, in the first embodiment, the epitaxial growth layer 26 of the bulk device region 11 and the SOI layer 23 of the SOI device region 12 are coupled with each other via a silicon group material, such as polysilicon or SiGe, stress at the boundary is reduced, Consequently, crystal defect due to stress is prevented.

Changes in mobility due to stress between two regions are also prevented, and those devices located near the boundary can be effectively protected from deterioration.

The boundary layer is located at the position where the sidewall protection film for covering the SOI layer used to exist, and therefore, increase in chip size is prevented. In addition, the device-fabrication surfaces of the bulk device region and the SOI device region are located at the same level, which is advantageous for the subsequent processes for fabricating trench isolations and gate electrodes using a lithography technique.

The second isolation in the SOI device region 12 is at the same depth as the first isolation in the bulk device region 11. Consequently, the second isolation in the SOI device region 12 can effectively prevent leakage current from the interface of the buried oxide.

The system-on-chip shown in FIG. 2, which has a DRAM macro and SOI logic on a single chip, is capable of high-speed data transfer between them at a reduced level of power consumption.

The bulk device region 11 includes not only the DRAM cells 43, but also the peripheral circuit 44 which form a functional block (i.e., a DRAM macro) as a whole, and consequently, the circuit design or the device design originally developed for a bulk substrate is applicable as it is to an SOI/bulk substrate. Of course, the bulk device region of the SOI/bulk substrate may include other functional macros developed for a bulk substrate, such as an analogue circuit macro, a high-breakdown-voltage circuit macro, and memory macro other than DRAM. In such a case, the circuit designs for these macros can be applied to the SOI/bulk substrate to form a system-on-chip semiconductor chip.

Using the fabrication method of the first embodiment, the isolations in both the bulk device region and the SOI device region, whose device-fabrication surfaces are at substantially the same level, are formed at once at the same etching rate so as to have the same depth. Accordingly, the process conditions, such as the thickness of the dielectric for filling the trench and the etchback time, are substantially the same over the bulk device region and the SOI device region. Consequently, the process for fabricating the isolations is simplified <Second Embodiment>

FIG. 4 illustrates a semiconductor chip 50 according to the second embodiment of the invention. The semiconductor chip 50 includes a base substrate 51, a bulk device region 11 having an epitaxial growth layer 56, and an SOI device region 12 having a buried oxide 52 positioned on the base substrate 51 and an SOI layer 53 on the buried oxide 52. The bulk device region 11 has a first device-fabrication surface, in which devices 43, 44 are positioned. The SOI device region 12 has a second device-fabrication surface, in which MOSFETs 45 are positioned The semiconductor chip SOI also includes a fist isolation 65a isolating the devices 43, 44 in the bulk device region 11, a second isolation 65b isolating the SOIMOSFETs 45 in the SOI device region 12, and a third isolation 65c located at the boundary between the bulk device region 11 and the SOI device region 12. In this embodiment, the third isolation 65c is the boundary layer.

in the second embodiment, the devices 43, 44 and other circuit elements (not shown) constitute a DRAM macro in the bulk device region 11, and the SOIMOSFETs 45 constitute an SOI logic in the SOI device region 12, as in the first embodiment The firsts second and third isolations 65a, 65b, and 65c are of the same depth and made of the same dielectric material. The isolations 65a, 65b and 65c are deeper than the buried oxide 52 of the SOI device region 12. The first device-fabrication surface of the bulk device region 11, in which the DRAM cell 43 is formed, is in substantial alignment with the second device-fabrication surface of the SOI device region 12, in which the SOIMOSFET 45 is positioned Consequently, the devices 43, 44 that constitute the DRAM macro and the devices (SOIMOSFET) 45 that constitute the SOI logic are positioned at substantially the same level.

The bulk device region 11 has the epitaxial growth layer 56 of single crystal silicon, as a bulk growth layer. The SOI device region 12 has the buried oxide 52 and the SOI layer 53 over the silicon hasp substrate 51. The total thickness of the buried oxide 52 and the SOI layer 53 is set at less than in the structure of the first embodiment. By reducing the thickness of the buried oxide 52, heat generated during operation of the SOI device escapes to the base substrate 51 effectively. This arrangement is desirable when deterioration of device characteristics due to heat has to be prevented.

Since the third isolation 65c is deeper than the buried oxide 52, it can prevent crystal defects, such as dislocation, generated at the boundary from spreading into the epitaxial growth layer 56.

Figure 5A:
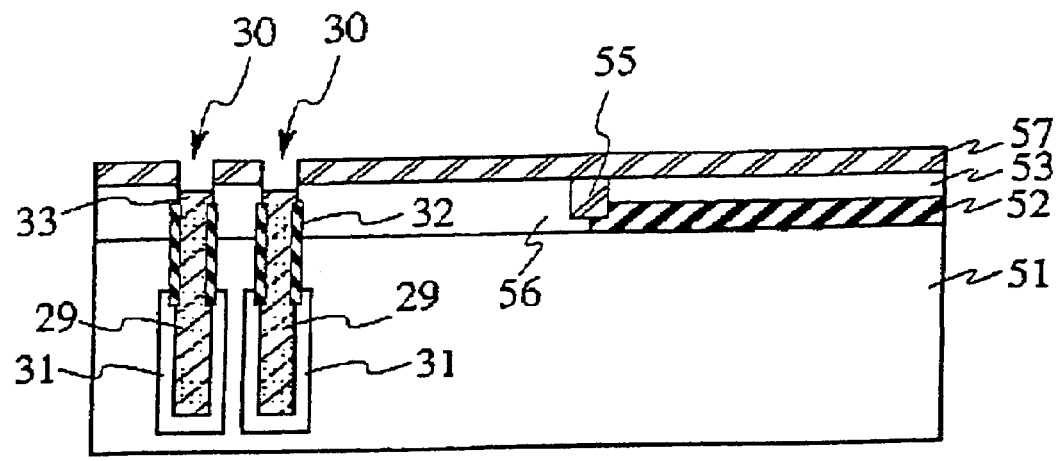
FIGS. 5A through 5C illustrate a fabrication process of the semiconductor chip shown in FIG. 4.
Figure 5B:
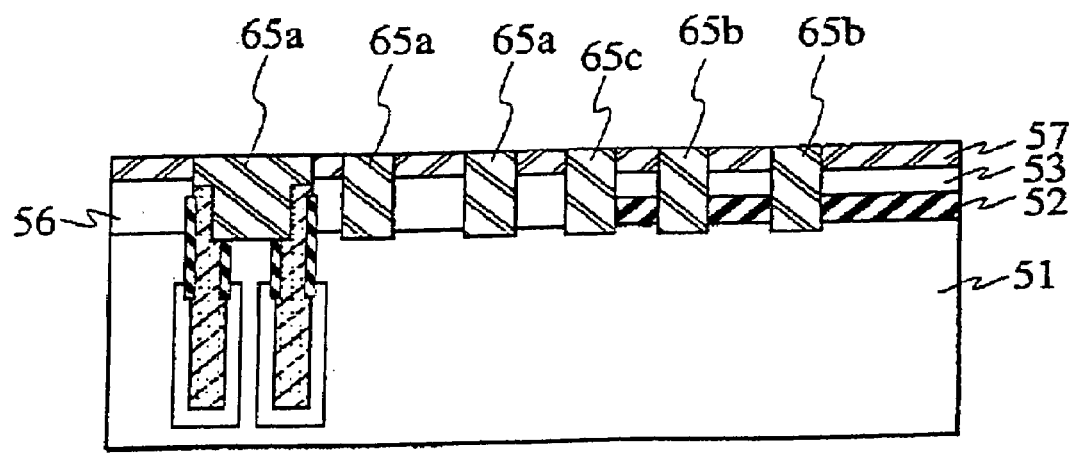
Figure 5C:
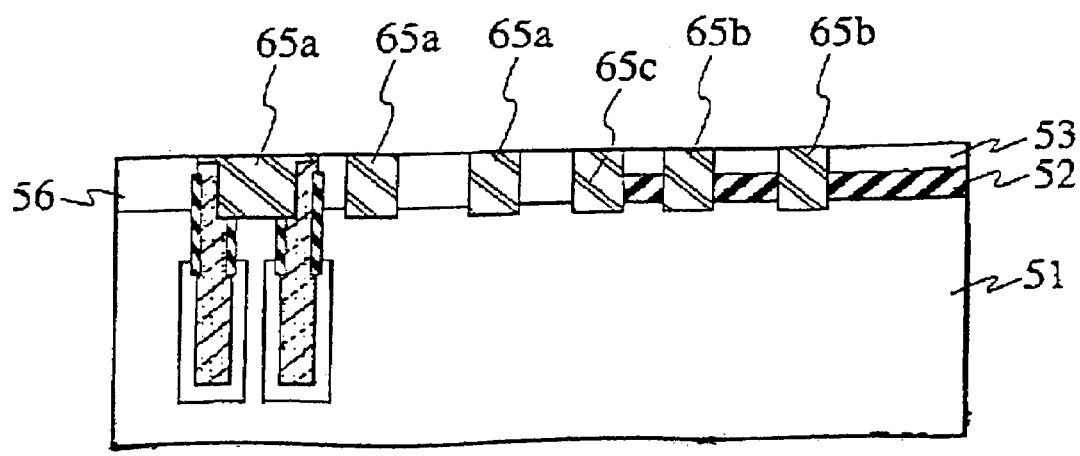

FIGS. 5A through 5C illustrate a fabrication process of the semiconductor chip 50 shown in FIG. 4. FIG. 5A follows the step shown in FIG. 3D. Steps 3A through 3D are in common with those in the first and second embodiments, except for the thickness of the buried oxide, and the explanation for them will be omitted.

In the first embodiment, the problem of stress was solved by removing the sidewall protection film and by filling the boundary with a silicon group material. However, if The epitaxial growth layer in contact with the sidewall protection film has already been damaged, the measure in the first embodiment is insufficient.

Then, in the second embodiment, to remove the crystal damage itself, an SOI substrate with a buried oxide thinner than that used in the first embodiment is used, or the depth of the isolations including one located at the boundary are set deeper than the buried oxide. The sidewall protection film and the area containing deteriorated crystal near the boundary are removed altogether when forming trenches for the isolations.

To be more precise, after the epitaxial growth layer 56 is formed in the bulk device region, as shown in FIG. 3D, mask layer 57 is formed over the entire surface covering the epitaxial growth layer 56, the SOI layer 53, and the sidewall protection film 55. The mask layer 57 is patterned into a predetermined pattern, and DRAM trench capacitors 30 are formed, as shown in FIG. 5A Then, as shown in FIG. 5B, isolations 65a, 65b, and 65c are formed in the bulk device region 11, the SOI device region 12, and at the boundary between them at the same time. If an etching condition where silicon, polysilicon, silicon nitride, and silicon dioxide are etched at the same rate is selected, trenches with the same depth can be formed at once in the same etching time. All the trenches are deeper than the buried oxide 52 of the SOI device region 12. Because the sidewall protection film 55 at the boundary is no deeper than the buried oxide 52, the sidewall protection film 55 and the area containing crystal defects near the boundary are removed altogether when forming the isolation trenches. The first isolation 65a in the bulk device region (or the DRAM macro) 11, the second isolation 65b in the SOI device region (or the SOL logic) 12, and the third isolation 65c at the boundary are formed at once by filling the trenches with the same dielectric material.

Then, as shown in FIG. 5C, the insulating layer filled in the trench is etched back, and the mask layer 57 is removed. Devices 43, 44, 45 are formed at predetermined positions, and the semiconductor chip 50 illustrated in FIG. 5 is accomplished.

In the second embodiment, the isolation 65c located at the boundary is deeper than the buried oxide 52, and the sidewall protection film 55 and the area containing crystal defect near the boundary are removed altogether when fabricating the isolation. With this arrangement, stress is reduced in the final product, and crystal defect, such as dislocation, is prevented from spreading from the boundary to the epitaxial growth layer 56.

This arrangement has the additional advantage that conventional isolation technique is applicable directly to the boundary treatment. The advantages of the prevention of increase in chip size and of the even and uniform device-fabrication surface are the same as those in the first embodiment.

<Third Embodiment>

Figure 6:
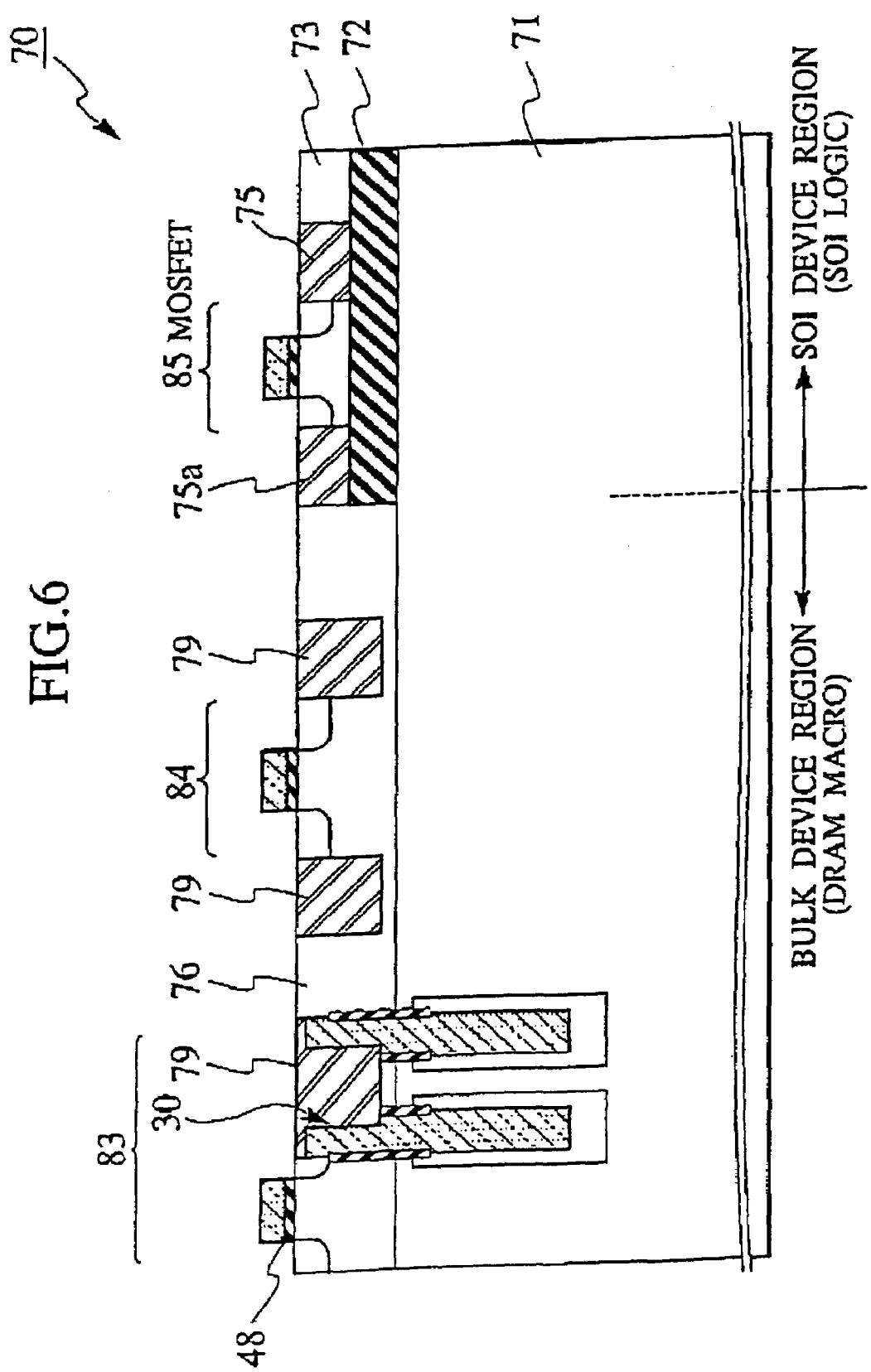
FIG. 6 is a schematic cross-sectional view of the semiconductor chip according to the third embodiment of the invention.

FIG. 6 schematically illustrates the semiconductor chip 70 according to the third embodiment of the invention. The semiconductor chip 70 comprises a bulk device region 11, in which a DRAM cell 83 and a peripheral MOSFET 84 are positioned, and an SOI device region 17, in which a SOI-MOSFET 85 is positioned. The bulk device region 11 includes fit isolations 79, and the SOI device region 12 includes second isolations 75a, 75, which are shallower than the first isolations 79.

Whichever the first or the second isolation that is positioned closest to the boundary functions as a boundary layer. In the example shown in FIG. 6, second isolation 75a located at the boundary in the SOI device region 12 becomes the boundary layer, and it is in contact with the buried oxide 72 at the bottom. Of course, first isolation 79 located at or nearest to the boundary in the SOI device region 11 can be the boundary layer, depending on the design. In such a case, first isolation 79 located at the boundary overlap the endmost first isolation 75a and a portion of the buried oxide 72 under the isolation 75a, although this configuration is not illustrated in the drawing.

The bulk device region 11 has an epitaxial growth layer 76 as a bulk growth layer. DRAM cell 83, and the peripheral MOSFET 84 positioned in the epitaxial growth layer 76 constitute a DRAM macro. The SOI device region 12 has an SOI layer 73 and a buried oxide 72 over the silicon base substrate 71. MOSFETs 85 formed in the SOI layer 73 constitute SOI logic. These devices are positioned at a uniform level over the bulk device region 11 and the SOI device region 12.

The semiconductor chip 70 of the third embodiment has the optimum isolations suitable for the bulk device region 11 and the SOI device region 12 independently, and therefore, the depth of the first isolation 79 and the second isolation 75 differ from each other. Either the first or second isolation, whichever is located at or nearest to the boundary (e.g, second isolation 75a in the SOI device region 12 in the example of FIG. 6), functions as the boundary layer between the bulk device region 11 and the SOI device region 12.

The optimum arrangement of isolation is desirable when the SOI logic requires particularly miniaturized pattern. In fact, logic design often requires miniature isolations, In order to form a trench deeper than the buried oxide in the SOI substrate in a circumstance where high miniaturization is required, the taper angle of the trench must be precisely controlled during etching of the side faces of the SOI layer and the buried oxide. In addition, if the post-treatment etches either the SOI layer 73 or the buried oxide 72 too much, the side faces of the trench become uneven. Without precise angle control in the angle or the treatment, a void is left inside the trench even after the trench is filled with a dielectric material. After the surface of the dielectric material is etched, the void can change to a hollow. In this case, when fabricating gate electrodes, the gate Material will enter the hollow, which may cause short-circuit or connection error.

For this reason, the optimum isolation is provided to the SOI device region 12 in the third embodiment. This arrangement has an advantage of guaranteeing reliable operation, while preventing short-circuit of the gate electrode or connection error, in addition to the aforementioned advantages of the reduction of stress, prevention of increase in chip side, and uniform level of device-fabrication surfaces.

In the semiconductor chip 70, whichever the first or the second isolation located nearest to the boundary functions as the boundary region. Accordingly, devices can be arranged at the closest possible position to the boundary, and dead space can be greatly reduced.

FIGS. 7A through 7F illustrate a fabrication process of the semiconductor chip 70.

Figure 7A:
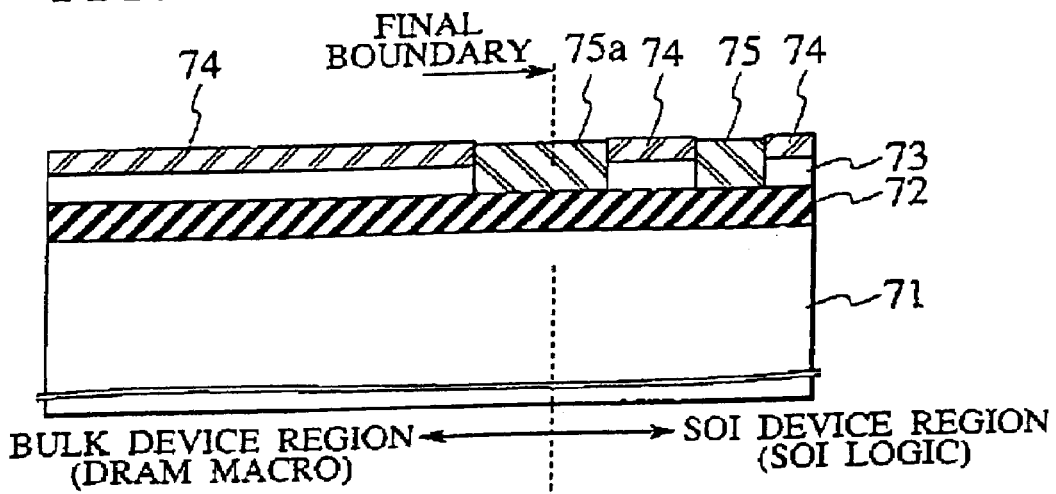
FIGS. 7A through 7F illustrate a fabrication process of the semiconductor chip shown in FIG. 6.

(a) First, as shown in FIG. 7A, shallow isolation 75 is formed inside the SOI device region 12, and another shallow isolation 75a is formed at the boundary over both the bulk device region 11 and the SOI device region 12. To be more precise, a mask material, such as silicon nitride, is deposited over the SOI substrate consisting of silicon base substrate 71, boned oxide 72, and SOI layer 73. The mask material is patterned into a first mask 74. Shallow trenches are formed by RIE at the exposed positions, which are then filled with a dielectric material, such as $SiO_2$, to form second isolations 75 and 75a.

Figure 7B:
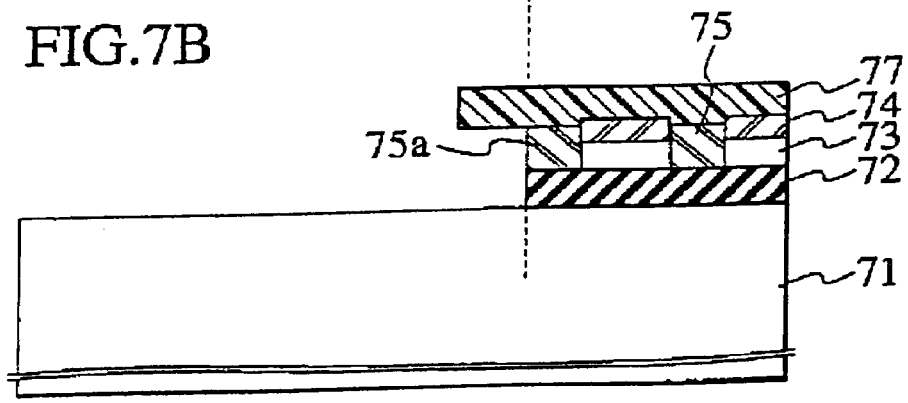

(b) Then, as shown in FIG. 7B, a second mask material (e.g., resist) is placed over the entire surface, and is patterned into a second mask 77 so as to cover the SOI device region 12 and the isolation 75a positioned at the boundary. Using the second mask 77, portions of the first mask 74, the SOI layer 73, the boundary isolation 75a, and the buried oxide 72 are etched. Preferably, the fist mask 74, the SOI layer 73, the boundary isolation 75a, and down to halfway through the buried oxide 72 are removed by RIE, and the silicon base substrate 71 is finally revealed by wet etching.

It is not necessary to form a sidewall protection film for protecting the SOI layer 73 because the side face of the SOI layer 73 is already covered with the second isolation 75a located at the boundary. Since both the buried oxide 72 and the second isolation 75a are $SiO_2$-related composite layers, the etching process is switched to wet processing at the final moment for revealing the silicon base substrate 71. Wet process allows portions of both the buried oxide 72 directly on the base substrate 71 and the second isolation 75a projecting into the bulk device region 11 to be removed without damaging the base substrate 71.

Figure 7C:
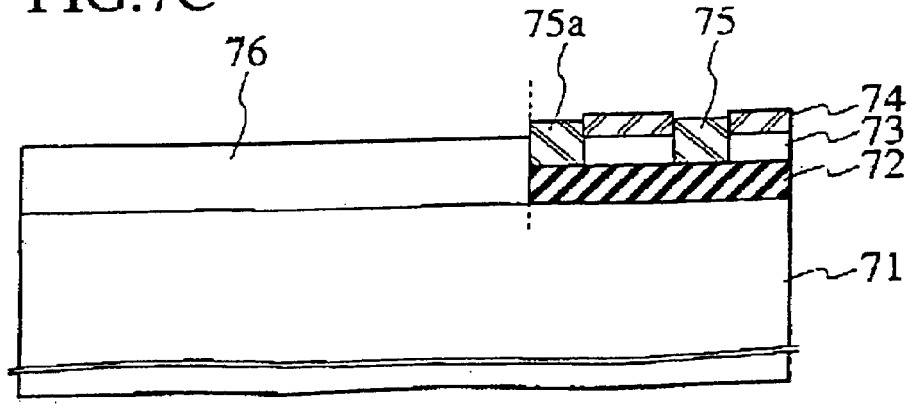

(c) Then, as shown in FIG. 7C, the second mask 77 is removed, and a single crystal silicon bulk layer 76 is formed on the exposed silicon base substrate 71 by epitaxial growth until it reaches the level of the SOI layer 73, thereby defining a bulk device region 11 in the SOI substrate.

Figure 7D:
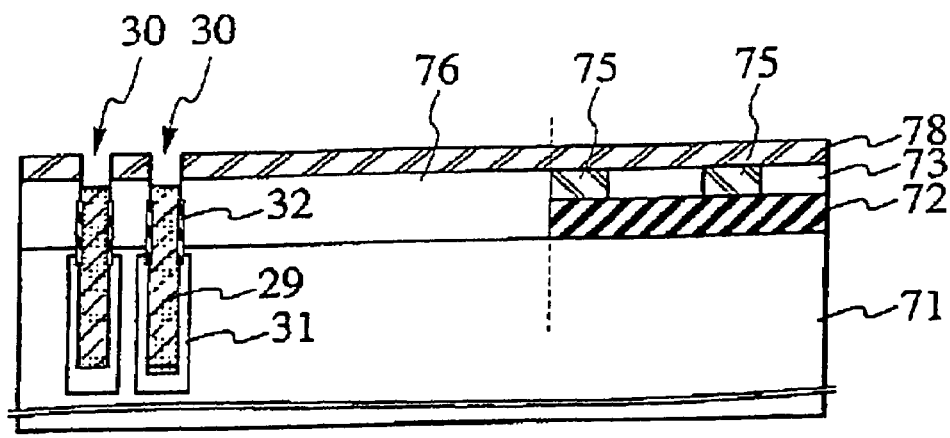

(d) Then, as shown in FIG. 7D, the first mask 74 is removed if necessary, and a new mask 78 is formed. Using the mask pattern 78, a trench capacitor 30 is fabricated in the bulk device region 11 as described in the first embodiment.

Figure 7E:
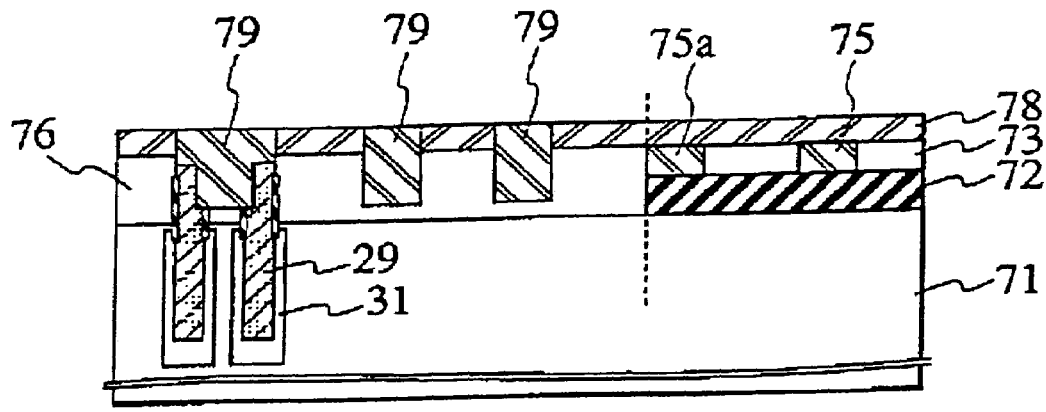

(e) Then, as shown in FIG. 7E, first isolation 79, which is deeper than the second isolation 75, is formed in the bulk device region 11.

Figure 7F:
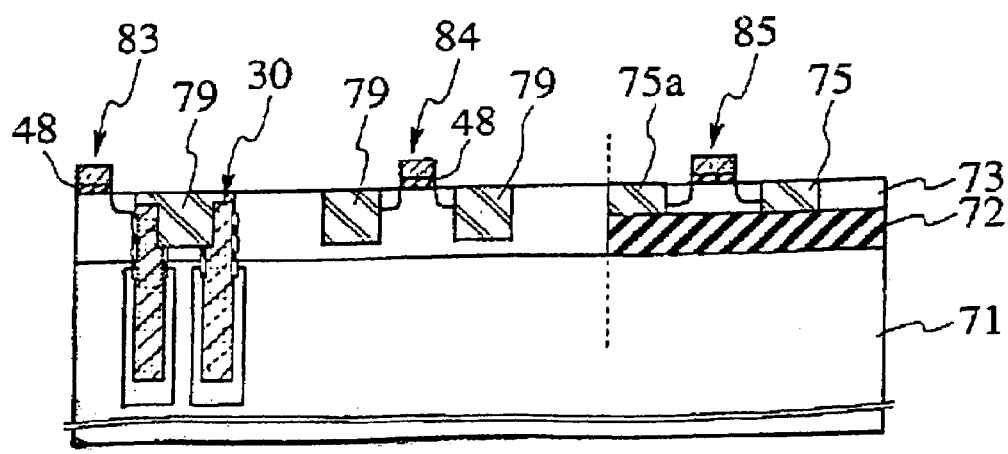

(f) Finally, as shown in FIG. 7F, the dielectric filled in the trench is etched back, and the mask 78 is removed. Transistors 83, 64, and 85 constituting a DRAM and SOI logic are fabricated on the bull device region 11 and the SOI device region 12.

Figure 8A:
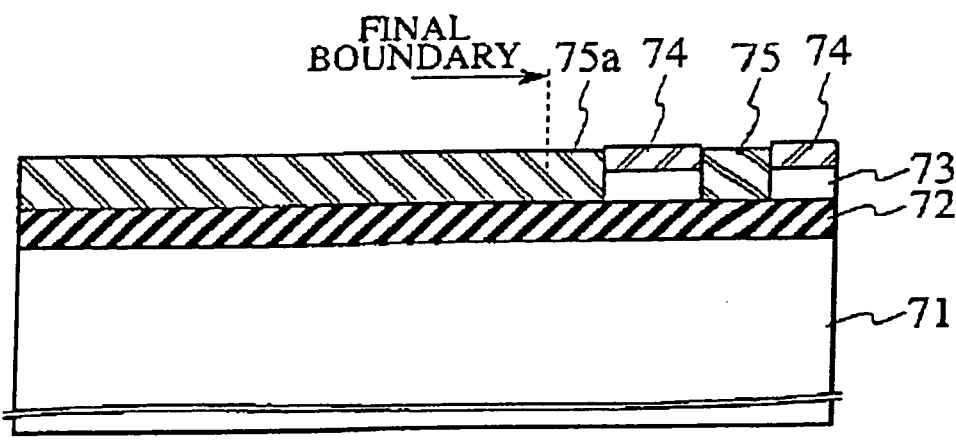
FIGS. 8A through 8C illustrate another fabrication process of the semiconductor chip shown in FIG. 6, where the steps subsequent to FIG. 8C are the same as those shown in FIGS. 7D through 7F.
Figure 8B:
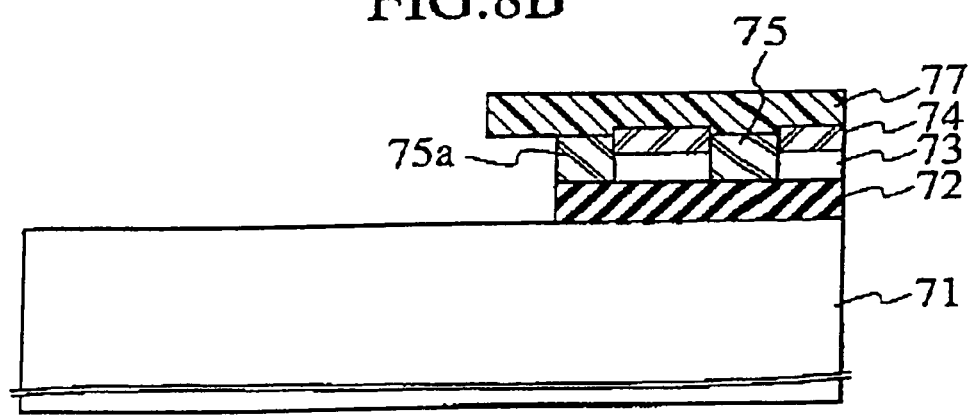
Figure 8C:
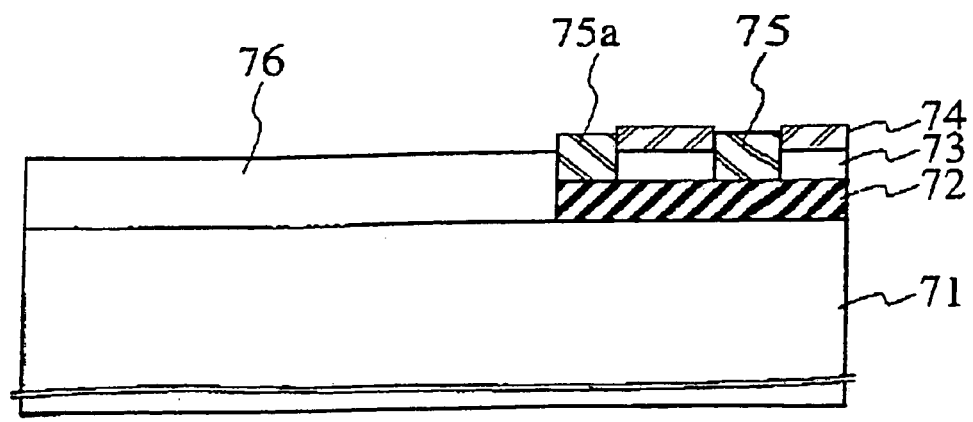

FIG. 8A through 8C illustrate an alternative process for fabricating the semiconductor chip 70. In the process shown in FIGS. 7A through 7F, the shallow isolations 75 and 75a were formed only in the SOI device region and at the boundary, and the area that is to be a bulk device region was covered with the mask 74 prior to forming the bulk device region. In the process shown in FIG. 8, isolation 75a is formed over the entire area that is to be the bulk device region.

First, as shown in FIG. 8A, a first mask layer is placed over the entire surface of the SOI layer 73, and is patterned into a first mask 74 so as to cover only those areas that are to become active areas in the SOI device region 12. The SOI layer 73 of the uncovered areas (i.e., the area that is to be a bulk device region 11 and the areas that are to be the isolations in the SOI device region 12) is removed, and dielectric layers 75 and 75a are formed.

Then, as shown in FIG. 8B, a second mask (e.g, a resist) 77 is provided over the SOI device region 12 and the portion of the bulk device region 11 near the boundary. In other words, the second mask 77 covers the entire area of the SOI device region 12 and slightly projects into the bulk device region 11. The isolation 75a and the buried oxide 72 are removed continuously by wet etching using the mask 77. Since a portion of the isolation 75a remain is at the boundary, the silicon base substrate 71 is revealed with the side face of the SOI layer 73 automatically protected by the boundary isolation 75a, without damaging the silicon base substrate 71.

Then, as shown in FIG. 8C, an epitaxial growth layer 76 is formed on the exposed base substrate 71 by selective epitaxial growth.

The subsequent steps are the same is those in FIGS. 7D through 7F. Using the method shown in FIG. 8, the top face of the silicon base substrate 71 Can be revealed by a single step of wet etching. Accordingly, even if the optimum isolations are fabricated in the bulk device region 11 and the SOI device region, independently, with different depth and materials, the fabrication process of the semiconductor chip is simplified as a whole.

In either method shown in FIG. 7 or 8, epitaxial growth and formation of trench capacitors, which accompany thermal processing at a high temperature, are carried out after, the isolations are formed in the SOI device region. Therefore, stress in the SOI device region can be reduced.

Devices can be fabricated at a uniform level over the bulk device region 11 and the SOI device region, as in the previous embodiments.

Since boundary isolation 75a, which belongs to either the bulk device region 11 or the SOI device region 12, is provided in advance before epitaxial growth, the side face of the SOI layer 73 is automatically protected without requiring an additional step for forming a sidewall protection film.

Removing both the boundary isolation 75a and the buried oxide 72 by wet etching can avoid damage to the silicon base substrate 71 when revealing the top surface thereof.

<Fourth Embodiment>

Figure 9A:
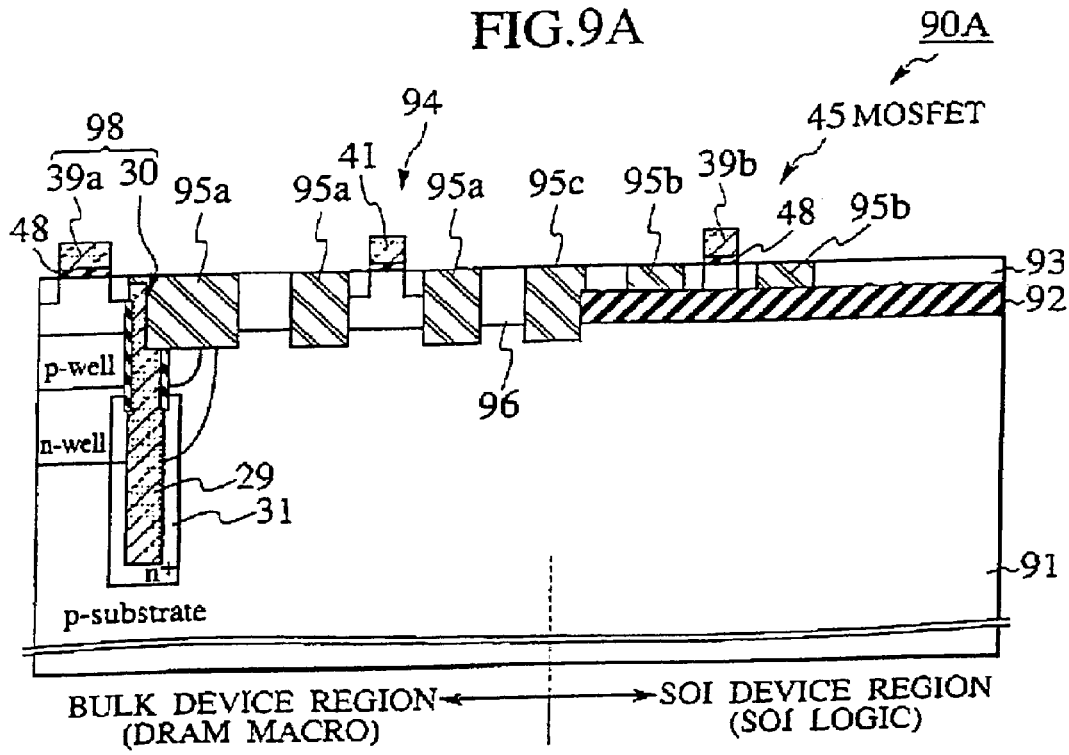
FIGS. 9A and 9B are schematic cross-sectional views of semiconductor chips according to the fourth embodiment of the invention.
Figure 9B:
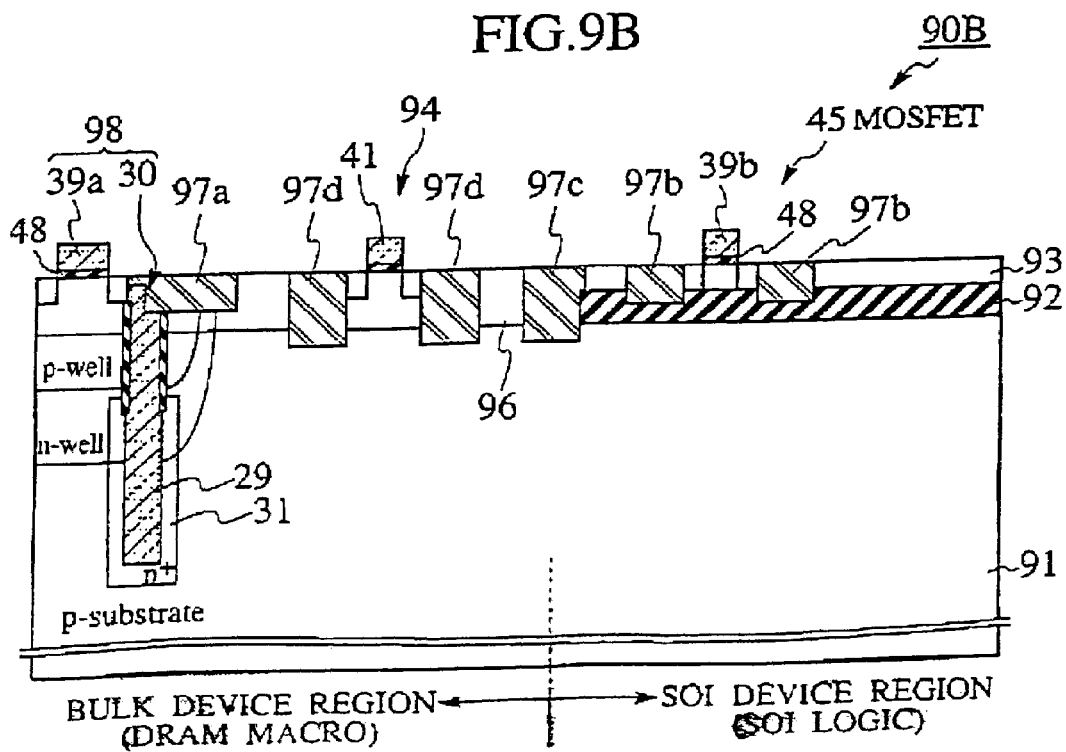

FIGS. 9A and 9B illustrate semiconductor chips according to the fourth embodiment of the invention. The fourth embodiment is a combination of the second and third embodiments. Isolation deeper than the buried oxide is provided at the boundary, which allows a sidewall protection film to be completely removed together with the surrounding area containing crystal defect, and at the same time, isolations are optimized in both the bulk device region and the SOI device region.

In the example shown in FIG. 9A, a semiconductor chip 90A comprises a base substrate 91, a bulk device region 11 having an epitaxial growth layer 96 positioned on the base substrate 91, and an SOI device region 12 having a buried oxide 92 on the base substrate 91 and an SOI layer 93 on the buried oxide 92. Devices 94, 98 are positioned in the epitaxial growth layer 96 in the bulk device region 11, and devices (SOIMOSFET) 45 are positioned in the SOI device region 12. The semiconductor chip 90A also has first isolations 95a separating the devices 94, 98 in the bulk device region 11, second isolations 95b separating the device 45 in the SOI device region 13 and a third isolation positioned at the boundary between the bulk device region 11 and the SOI device region 12. The second isolation 95b positioned in the SOI device region 12 is shallower than the fist and third isolations 95a and 95c. The third isolation 95c positioned at the boundary is deeper than the buried oxide 92, and can prevent crystal defect, which may occur at the edge of the buried oxide 92 or the sidewall protection film, from spreading toward the bulk device region 11.

The device-fabrication surfaces of the bulk device region 11 and the SOI device region 12 align with each other, and therefore a DRAM cell 98 and other circuit elements 94 arranged in the bulk device region 11 and an SOIMOSFET 45 positioned in the SOI device region 12 are at a substantially uniform level.

To fabricate the semiconductor chip 90A, those steps up to fabricating DRAM trench capacitors are the same as those shown in FIGS. 3A through 3E, or in FIGS. 7A through 7F. Then, first isolations 95a in the bulk device region 11 and a third isolation 95c located at the boundary are formed using the same lithography process. If the steps shown in FIGS. 3A through 3E are employed, the sidewall protection film and its surroundings containing damaged silicon are removed at once when forming the third isolation 95c. Second isolations 95b are formed in the SOI device region 12 by a separate lithography process even if the processes shown in FIGS. 3A through 3E are used. In the example shown in FIG. 9A, the third isolation 95c slightly overlaps the buried oxide 92, getting into the SOI layer 93. However, it may slightly project into the buried oxide 92, depending on the etching condition If the endmost second isolation 95b in the SOI device region 12 is located very close to the boundary, the endmost second isolation 95b and the boundary isolation (i.e., the third isolation) 95c may overlap each other, resulting in the third isolation 95 with the same structure as that shown in FIG. 9A.

In the example in FIG. 9B, a semiconductor chip 9B has a first isolation 97a separating a DRAM cell 98 in the bulk device region 11, a second isolation 97b separating an SOIMOSFET 45 in the SOI device region 12, and a third isolation 97c located at the boundary. The first and second isolations 97a and 97b are of substantially the same depth, and are shallower than the third isolation 97c. The third isolation 97c is set to be deeper than the buried Oxide 92 in order to remove the sidewall protection film (not shown) together with the nearby damaged silicon.

The first isolation 97a for the DRAM cell 98 is as shallow as the second isolation 97b separating the SOI device 45 in order to reduce the plug resistance of the storage node electrode 29 of the trench capacitor 30. In this manner, isolations in both the bulk device region 11 and the SOI device region 12 are optimized. The fourth isolations 97d for separating the peripheral MOSFETs 94 may be fabricated at the same depth and at the same time as the third isolation 97c using the same material. Alternatively, the fourth isolation 97d may be formed together with the fist and the second isolations 97a and 97b.

In either example of FIG. 9A or 9B, the devices (e.g, DRAM cells 98) arranged in the bulk device region 11 and the devices (e.g, SOIMOSFETs 45) arranged in the SOI device region 12 are positioned at a uniform level.

Because the sidewall protection film and the nearby area in the bulk growth layer 96, which may have been damaged, are removed at once when forming isolations, problems caused by stress can be eliminated. In addition, isolations can be optimized in both the bulk device region and the SOI device region, and operation reliability is improved. The advantages of avoiding an increase in chip size and of the uniform level of the device-fabrication surfaces are the same as those in the third embodiment.

<Fifth Embodiment>

Figure 10:
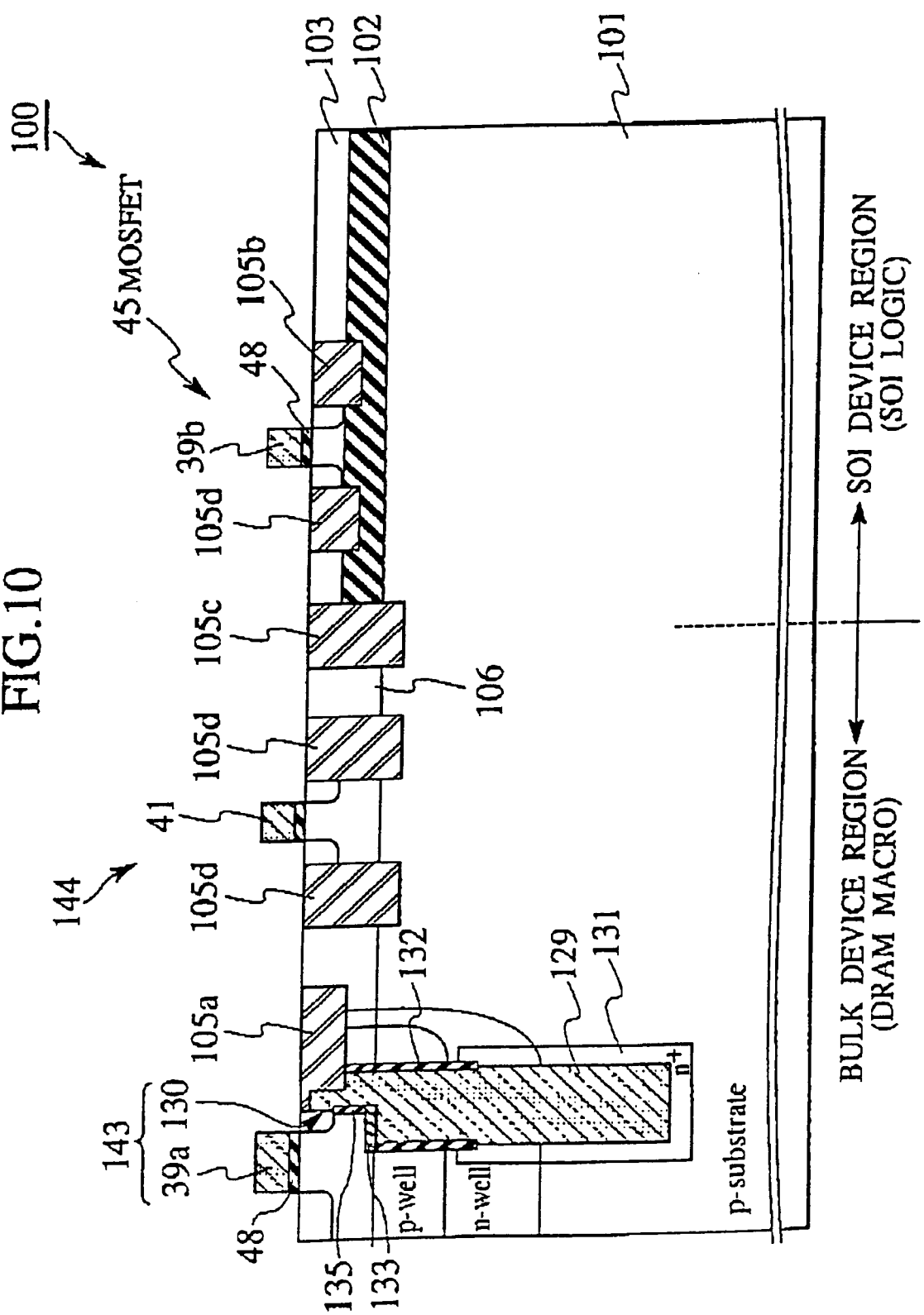
FIG. 10 is a schematic cross-sectional view of the semiconductor chip according to the fifth embodiment of the invention.

FIG. 10 illustrates a semiconductor chip 100 according to the fifth embodiment of the invention.

Semiconductor chip 100, which is a system-on-chip having multiple function blocks, makes more efficient use of the bulk device region 11 when DRAM cell with trench capacitors are formed in the bulk device region 11. Consequently, the storage capacitance of the DRAM is increased without increasing the area size, or in other words, the trench capacitors are arranged at a higher density.

The semiconductor chip 100 comprises a base substrate 101, a bulk device region 11 having an epitaxial growth layer 106 formed on the base substrate SOI, and an SOI device region 12 having a buried oxide 102 positioned on the base substrate 101 and an SOI layer positioned on the buried oxide 102. In the bulk device region 11, DRAM cells 143 are formed. In the SOI device region 12, SOIMOSFET devices 45 are formed in the SOI layer 103. The semiconductor chip 100 also has a first isolation 105a separating the DRAM cell 143 in the bulk device region 11, a second isolation 105b separating the MOSFET 45 in the SOI device region 12, and a third isolation 103c located at the boundary between the bulk device region 11 and the SOI device region 12. In the bulk device region 11, the peripheral MOSFET 144 is isolated by the fourth isolation 105, which is of the same depth as the third isolation 105c.

In the example shown in FIG. 10, the third isolation 105c is positioned at the boundary independently, and is set to be deeper than the buried oxide 102. However, as illustrated in the third embodiment referring to FIG. 6, either the endmost second isolation 105b in the SOI device region 12 or the endmost fourth isolation 105d in the bulk device region 11 may function as the boundary isolation.

The DRAM cell 143 formed in the bulk device region 11 has a trench capacitor 130 consisting of a lower part (or fit part) located under the interface between epitaxial growth layer 106 and the base substrate 101, and an upper pan (or second part) located above the interface (i.e., in the epitaxial growth layer 106). The width or the lateral cross-sectional area of the lower part is greater than that of the upper part. The lower part (or the first part) of the trench capacitor 130, which is positioned under the interface with the bulk growth layer 106, extends into at least a part of the region directly below the gate 39a of the DRAM cell transistor.

By expanding the trench capacitor 130 toward the region directly below the cell transistor, the storage capacitance can be increased without increasing the area size of the DRAM sell array (not shown).

The semiconductor chip 100 having the above-described capacitor structure makes good use of the SOI/bulk substrate fabrication process required for a system-on-chip. In order to fabricate a SOI/bulk substrate, a predetermined area of the SOI layer 103 and the buried oxide 102 are removed from the SOI substrate to reveal the base substrate 101. Then, the epitaxial growth layer 106 is grown from the exposed surface of the base substrate 101. If the capacitor structure shown in FIG. 10 is realized in a DRAM chip using a bulk substrate, the lower part (or first part) of the trench capacitor is formed in the bulk substrate, and then, a silicon layer has to be epitaxially grown on the bulk substrate by a separate process in order to form the upper part (or second part). However, in the system-on-chip 100, the profile of the trench capacitor can be adjusted into a desirable from by making use of the fabrication process of the SOI/bulk substrate, and thereby increasing the storage capacitance.

FIGS. 11A through 11G illustrate a fabrication process of the semiconductor chip (system-on-chip) 100.

Figure 11A:
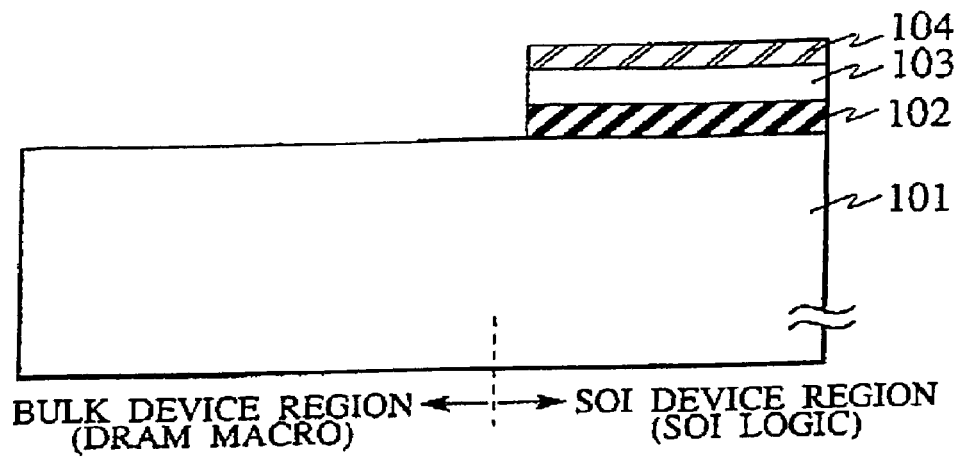
FIGS. 11A through 11G illustrate a fabrication process of the semiconductor chip shown in FIG. 10.

(a) First, as shown in FIG. 11A, a mask pattern 104 made of an arbitrary mask material (e.g., SiO$_2$, SiN, Si$_3$N$_4$) or a composite material is formed on the SOI wafer consisting of a silicon (Si) base substrate 101, a buried oxide 102, and an SOI layer 103. In the area that is not covered with the mask pattern 104, the SOI layer 103 and the buried oxide 102 are removed by, for example, RIE in order to partially reveal the base substrate 101. The last stage for removing the buried oxide 102 may be conducted by wet etching in order to minimize damage to the silicon base substrate 101.

Figure 11B:
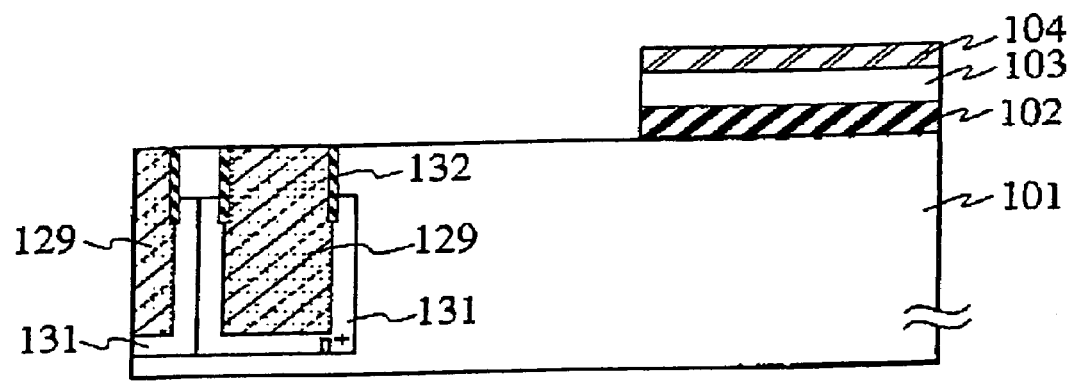

(b) Then, as shown in FIG. 11B, a lower part (or fist part) of the DRAM trench capacitor is formed in the exposed silicon base substrate 101. For example, a trench is formed by RIE, and a lower diffusion plate 131 is formed. Dielectric (not shown) is formed in the trench, and the trench is filled with polysilicon up to the middle. Collar oxide 132 is formed, and the trench is further filled with the polysilicon to form the storage node electrode 129, which is to be the lower part (or first part) of the trench capacitor extending into the base substrate 101.

Figure 11C:
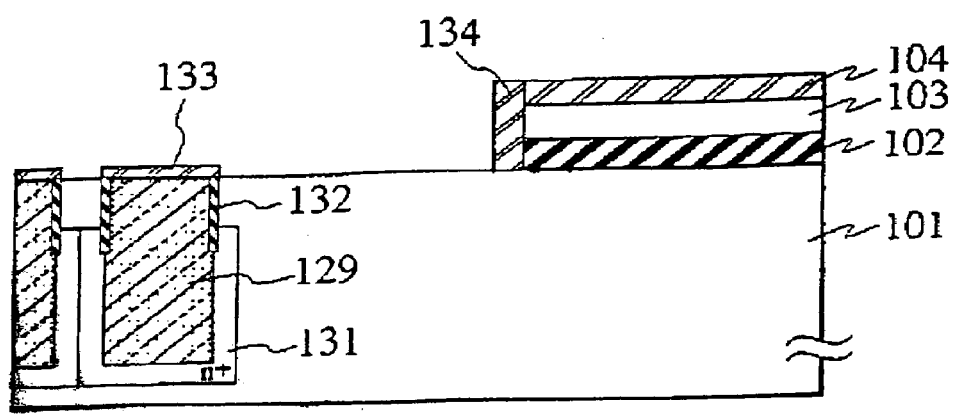

(c) Then, as shown in FIG. 11C, a stopper 133 and a sidewall protection film 134 are formed to cover the lower part of the trench capacitor and the exposed side face of the SOI layer 103, respectively. The stopper 133 and the sidewall protection film 134 are made of silicon nitride or other suitable material.

Figure 11D:
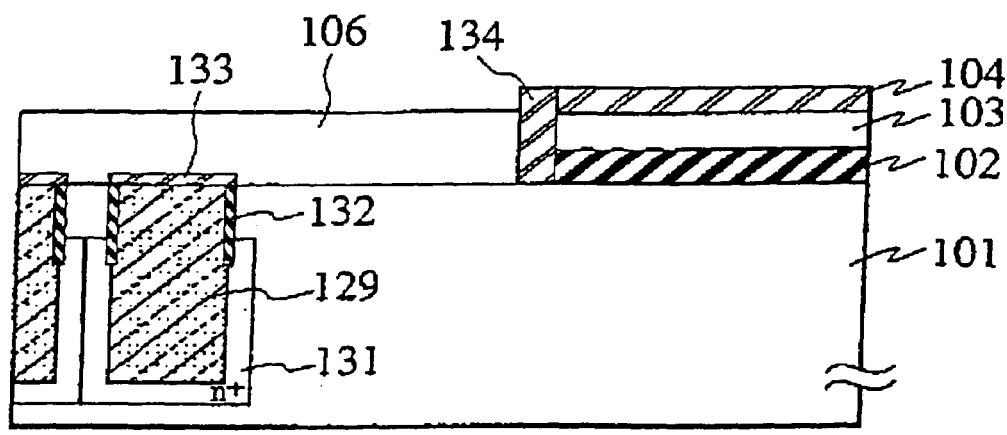
Figure 11E:
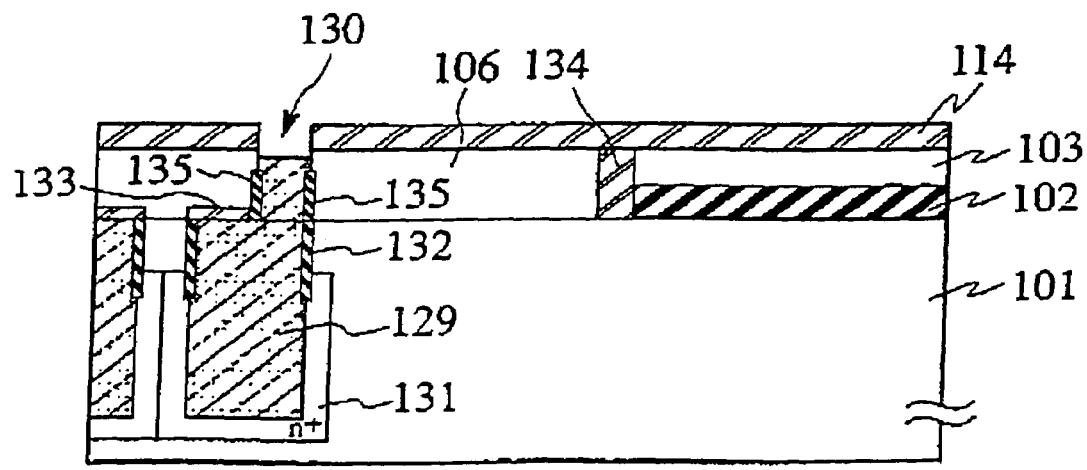

(d) Then, as shown in FIG. 11D, an epitaxial growth layer 106 is formed on the exposed base substrate 101 so as to be in alignment with the top face of the SOI layer 103. The epitaxial growth layer 106 is formed by selective epitaxial growth using, for example, dichroloresilane (SiH$_2$Cl$_2$) as a source gas (e) Then, as shown in FIG. 11E, a mask pattern 114 is formed over the bulk device region 11 and the SOI device region 12, and an opening that reaches the first part of the trench capacitor 130 is formed in the expitaxial growth layer 106. The width or the lateral cross-sectional area of the opening is smaller than that of the firs part formed in the base substrate 101. A collar dioxide 135 is formed on the sidewall of the opening, and the opening is filled with polysilicon to form a second part (or an upper part) of the trench capacitor 130. The second part electrically connects the first part to the cell transitor that is to be formed above the trench capacitor 130.

Figure 11F:
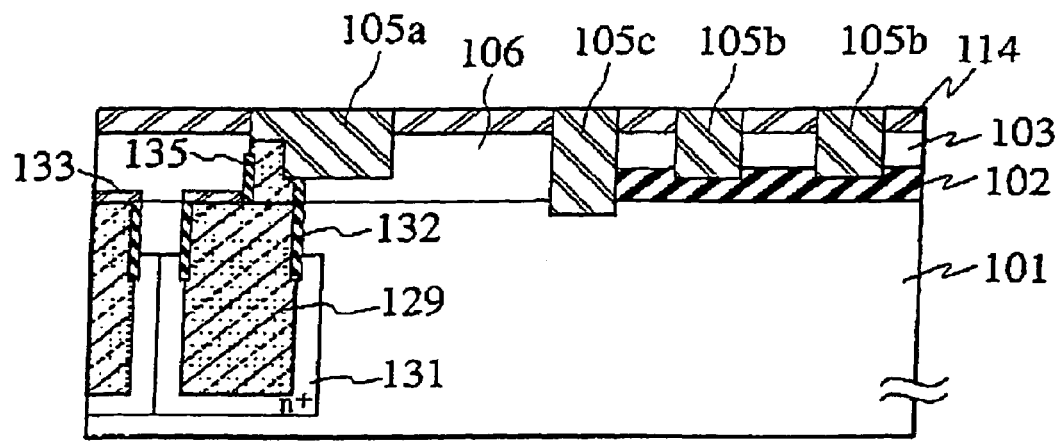

(f) Then, as shown in FIG. 11F, fist isolations 105a positioned in the bulk device region 11, second isolations 105b positioned in the SOI device region 12, and a third isolation 105c located at the boundary between the bulk device region 11 and the SOI device region 12 are formed When forming the third isolation 105c, the sidewall protection film 134 and the surrounding area containing damaged silicon are removed. Although no shown in FIG. 11F, isolations for the peripheral circuit (not shown), which may be formed in the bulk device region 11, are also formed at this stage. The third isolation 105c may be formed by a separate process from the first and second isolations 105a, 105b. Because the width of the second part (i.e., the upper part) of the trench capacitor 130 formed in the bulk growth layer 106 is relatively small, it is desirable for the first isolation 105a to be as s allow as the second isolation 105b in the SOI device region 12. Alternatively, they may be formed together with the first and second isolations 105a and 105b in the same process for simplicity of the process.

Figure 11G:
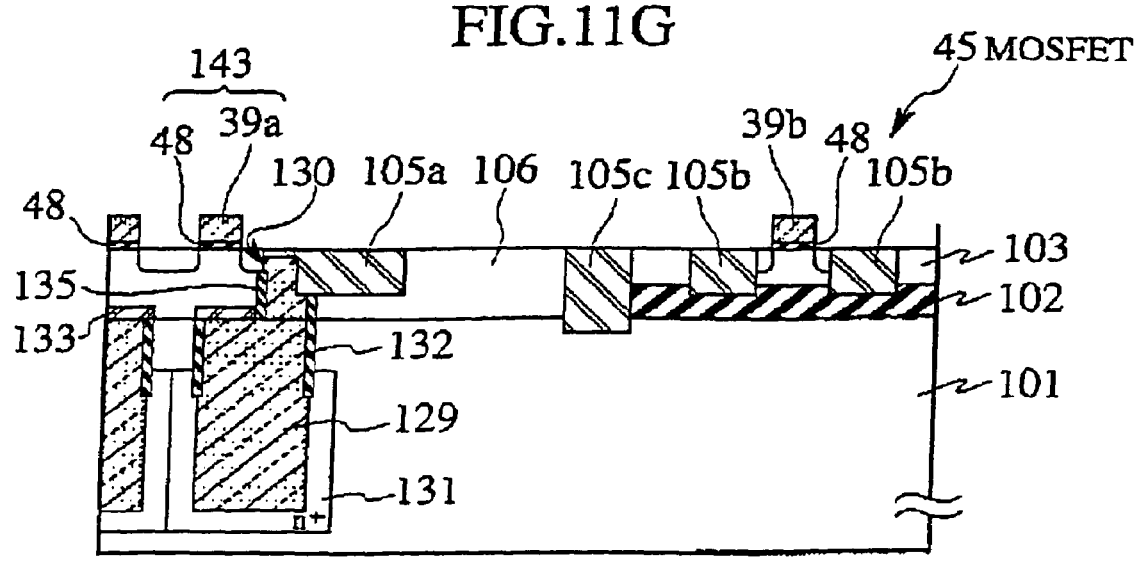

(g) Then, as shown in FIG. 11G, DRAM cell transistors 143 and SOIMOSFETs 45 are formed in the bulk device region 11 and the SOI device region 12, respectively. Transistors constituting the peripheral circuit 144 may also be formed, thereby producing the semiconductor chip 100 illustrated in FIG. 10.

FIG. 12 illustrates a modification of the semiconductor chip 100. The modification shown in FIG. 12 is a combination of the DRAM cell structure of the fifth embodiment shown in FIG. 10 and the boundary structure of the third embodiment shown in FIG. 6. The modification of FIG. 12 also includes a structural example of multilevel interconnection formed on or above the device-fabrication surfaces of the bulk device region 11 and the SOI device region 12).

The semiconductor chip shown in FIG. 12 has first isolations 107a separating the DRAM cells 143 in the bulk device region 11, and second isolations 107b, 107c separating the devices (e.g., SOIMOSFETs) 45 in the SOI device region 12. The endmost isolation 107c in the SOI device region 12 functions as a boundary layer.

Bit lines 125 and word lines are provided above the DRAM cells 143. The drain of the DRAM cell 143 is connected to the associated bit line 125 via the bit-line contact plug 124. In the SOI device region 12, silicide 123 is provided on the source and drain of the SOIMOSFET 45 for the purpose of reducing resistance. The SOIMOSFET 45 is connected to the upper layer Al interconnection 127 via the plug 128.

To fabricate the semiconductor chip shown in FIG. 12, the second isolations 107b, 107c are formed ill the SOI device region 12 in advances and the silicon base substrate 101 is revealed in the predetermined area using either the process illustrated in FIGS. 7A and 7B or the process shown in FIGS. 8A and 8B. Then, a relatively wide first part of the trench capacitor is formed in the exposed silicon base substrate 101. Then, the stopper 133 is placed on the top face of the first part of the trench capacitor 130, and bulk growth layer 106 is formed by, for example, selective epitaxial growth on the silicon base substrate 101. During the epitaxial growth, the side face of the SOI layer 103 is protected by the endmost second isolation 107c positioned at the boundary, which automatically functions as a sidewall protection film.

Then, the second part of the trench capacitor 130, which is narrower than the first part, is formed in the epitaxial growth layer 106. The first isolations 107a are also formed in the epitaxial growth layer (i.e., in the bulk device region 11). Then, DRAM cells 143 (FIG. 10), SOIMOSFETs 45, and devices 144 of the peripheral circuit are formed in the respective regions 11 and 12. The protection film 122 is formed over the entire surface, and the silicide 123 is provided on the source and drain of the SOIMOSFET 45 where the protection film is removed selectively. The interlevel dielectric 121 is deposited. The bit-line contact plug 124 for connecting the drain of the DRAM cell transistor 143 to the bit line 125, and the plug 128 for connecting the source and the drain of the SOIMOSFET 45 to the upper-level interconnection, are formed, Finally, upper-level interconnections 125, 126 and 127 are formed using an ordinary technique.

In the example shown in FIG. 12, the first part of the trench capacitor 130 expands toward the region directly below the DRAM cell transistor, making good use of the silicon base substrate 10. This arrangement allows the storage capacitance or the arrangement density of the trench capacitor to be increased without increasing the DRAM array size. In addition, the endmost second isolation 107c functions as the boundary layer. Consequently, stress at the boundary is reduced, and increase in chip size is prevented Selective epitaxial growth allows the device fabrication surfaces of the bulk growth layer 106 and the SOI layer 103 to be in alignment with each other, and the devices belonging to different functional blocks can be arranged at a uniform level.

<Sixth Embodiment>

Figure 13:
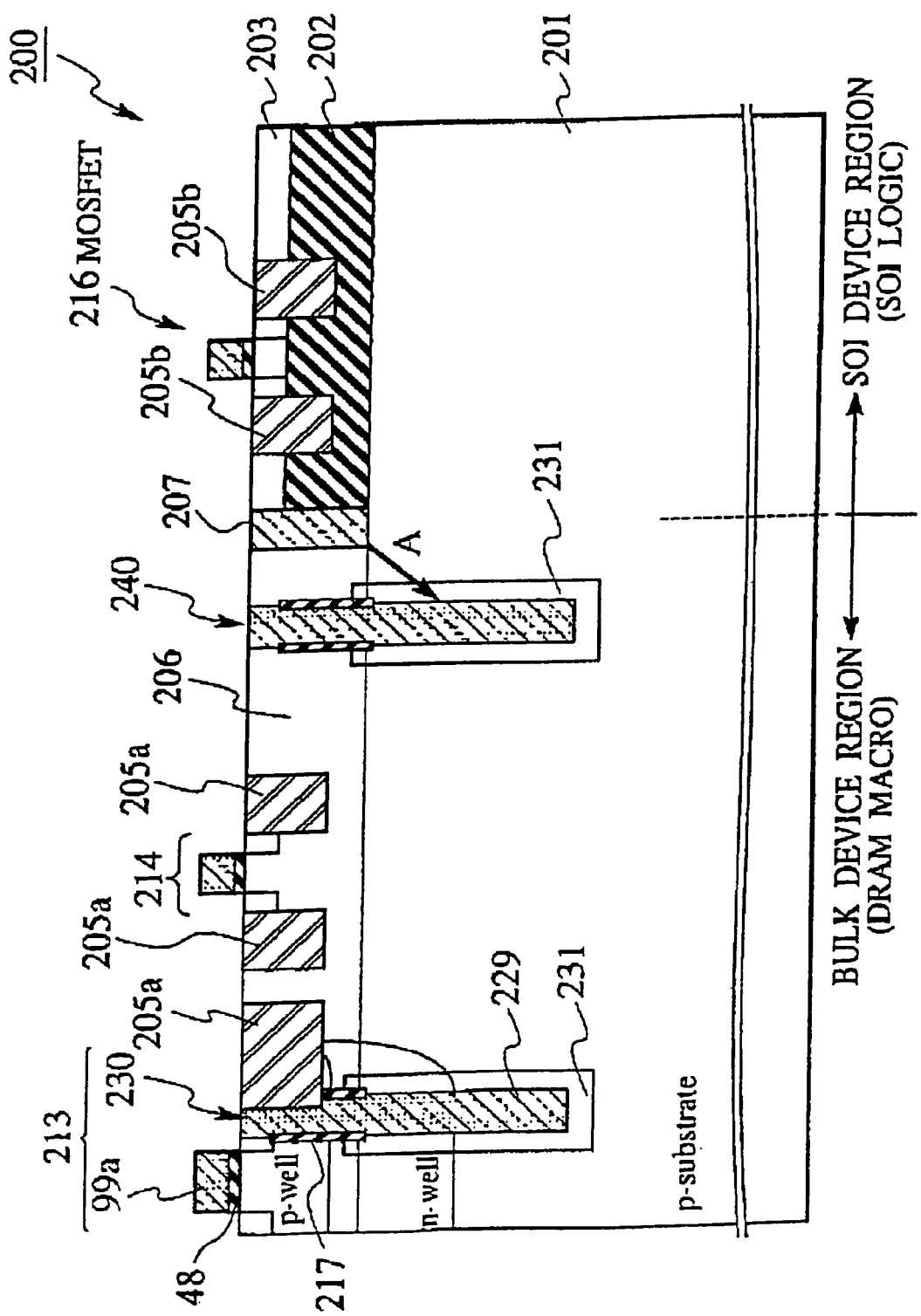
FIG. 13 is a schematic cross-sectional view of the semiconductor chip according to the sixth embodiment of the invention.

FIG. 13 schematically illustrates the semiconductor chip 200 according to the sixth embodiment of the invention. The semiconductor chip 200 comprises a silicon base substrate 201, a bulk device region 11 having a bulk growth layer (e.g., an epitaxial growth layer) 206 on the base substrate 201, an SOI device region 12 having a buried oxide 202 on the base substrate 201 and a SOI layer 203 on the buried oxide 202, a boundary layer 407 located at the boundary between the bulk device region 11 and the SOI device region 12, and a dummy capacitor (or a dummy pattern) 240. The dummy capacitor 240 is positioned in the bulk device region 11 near the boundary.

The semiconductor chip 200 also has DRAM cells 213 and peripheral MOSFETs 214 positioned in the bulk device region 11, and SOIMOSFETs 216 positioned in the SOI device region 12. The device-fabrication surface of the bulk growth layer 206, in which the DRAM cells 213 and the peripheral MOSFETs 214 are formed, and the device-fabrication surface of the SOI layer 203, in which the SOIMOSFET 216 is formed, are at substantially the same level.

The devices in the bulk device region 11 are separated from one another by first isolation 205a, and the devices in the SOI device region are separated from one another by second isolations 205b. The depth of the first and second isolations 205a and 205b are substantially the same in the example shown in FIG. 13. However, the second isolation 205b may be Set to be shallower as long as it reaches the buried oxide 202. By selecting such an etching condition that the etching rate with respect to silicon is much smaller than that for dioxide, the first and second isolations 205a and 205b with different depths are formed by the same process.

The depth of the dummy capacitor 240 is set to be deeper than the buried oxide 202 of the SOI device region 12. Even if dislocation occurs at the boundary between the bulk device region 11 and the SOI device region 12 and advances toward the bulk device region 11 as indicated by the arrow A, the dummy capacitor 240 stops the dislocation from expanding into the bulk device region 11.

In the example shown in FIG. 13, the dummy pattern is formed as a dummy capacitor 240 having the same shape and structure as the trench capacitor 240 of the DRAM cell 213 positioned in the bulk device region 11. Accordingly, the dummy capacitor 240 is filled with the same material as the storage electrode 229, and has diffusion layer (or lower electrode) 231 and collar dioxide 217. However, the dummy 240 does not necessarily have diffusion layer 231 or collar dioxide 217. Alternatively, the dummy capacitor 240 may be furnished with isolation, for example, the first isolation 205a, in order to make, the dummy electrically inactive.

Such a dummy structure is applicable to all of the previous embodiments. For example, although the semiconductor chip 200 shown in FIG. 13 has a boundary layer 207, as in the embodiment 1 shown in FIG. 2, an independent isolation 65c may be positioned at the boundary as the boundary layer. In this case, the dummy capacitor 240 is located in the bulk device region 11 near the boundary isolation 65c. In addition, the endmost isolation 75a in the 501 device region 12 may function as the boundary layer, as illustrated in FIG. 7. In this case, the dummy capacitor is again located in the bulk device region near the endmost isolation 75a. If the trench capacitor has the two-part structure shown in FIG. 10, the dummy capacitor 240 may be formed in the same shape and structure as the trench capacitor 130. However, the dummy may, of course, be formed in a different shape from the trench capacitor 130 (for example, without the upper electrode). In any cases, the dummy capacitor 240 is deeper than the buried oxide 202 of the SOI device region 12.

The dummy pattern is formed immediately after the epitaxial growth layer 206 is formed. If the system-on-chip has a trench-capacitor DRAM macro as a functional block in the bulk device region, as illustrated in the embodiments, it is desirable to form the dummy capacitor by the same process used in fabricating the trench capacitors.

Figure 14:
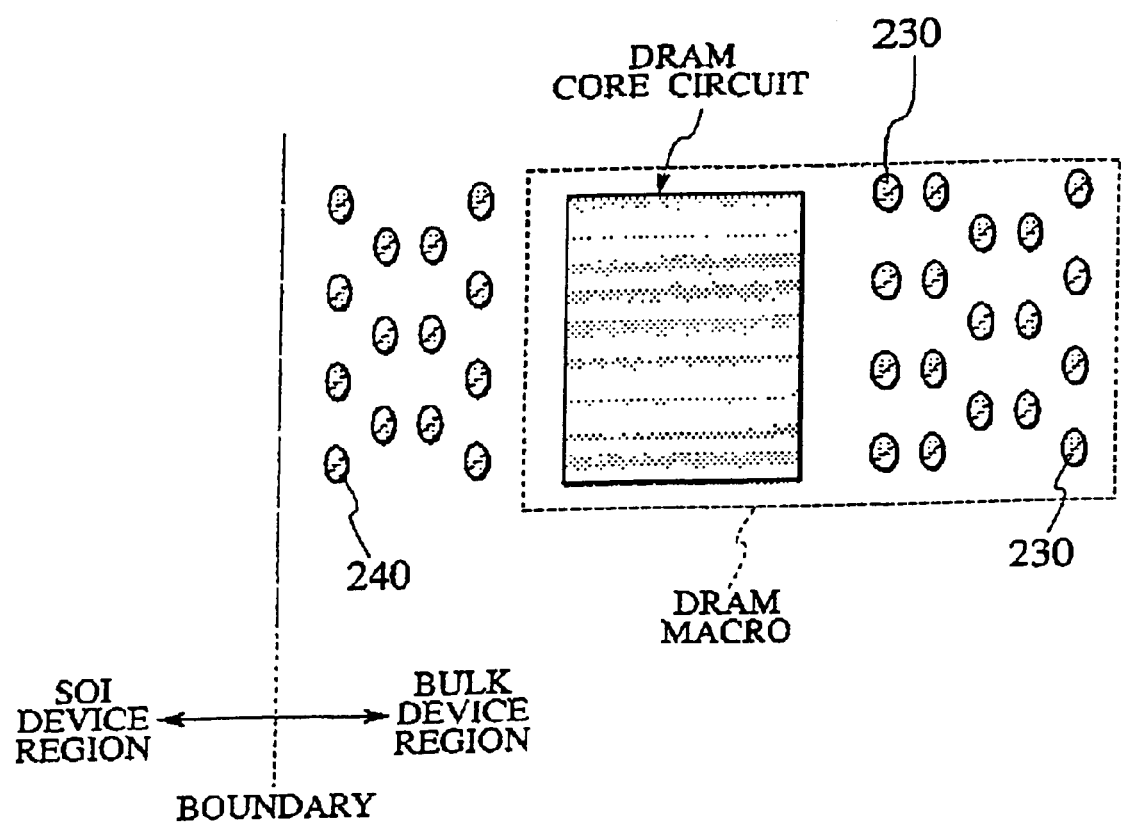
FIG. 14 illustrates an example of an arrangement of the dummy capacitors used in the semiconductor Chip shown in FIG. 13.

FIG. 14 illustrates a layout example of the dummy capacitor 240 shown in FIG. 13. In this example, dummy capacitors 240, which have the same structure as the DRAM cell trench capacitors 230, are arranged along the boundary between the bulk device region 11 and the SOI device region 12. As has been mentioned above, the dummy capacitor 240 may not necessarily have the same structure as the trench capacitors 230. However, the similarity in structure allows the process conditions to be agreed with those for the fabrication of the memory cells. The depth of the dummy capacitor 240 is set to be deeper than the buried oxide in the SOI device region 12.

Figure 15A:
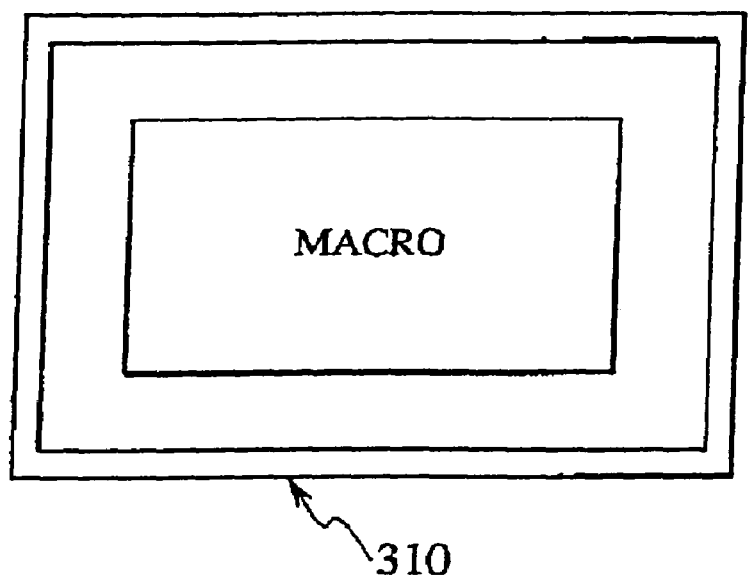
FIG. 15 illustrates modifications of the dummy pattern used in the semiconductor chip shown in FIG. 13.
Figure 15B:
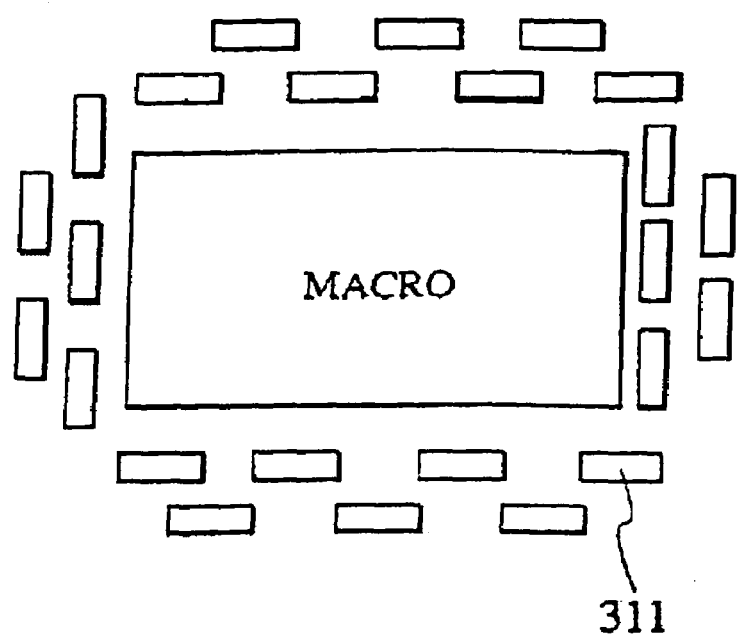

FIG. 15 illustrates modifications of the dummy pattern for preventing expansion of dislocation more effectively. FIG. 15A shows line dummy 310 surrounding the macro (e.g., DRAM macro) in the bulk device region 11, and FIG. 15B shows island dummies 311 surrounding the macro. In either example, the dummy pattern is formed immediately after the bulk growth layer (e.g., the epitaxial growth layer) is formed in the bulk device region 11. If the bulk device region 11 includes a DRAM macro as a functional block, the dummy patterns 310 and 311 are formed when the DRAM trench capacitors are formed. In this case, the line width of the line dummy 310 is desirably set to be in agreement with the short side of the capacitor pattern of the DRAM cell. Similarly, the short side of the island dummy 311 is desirably set to be in agreement with the short side of the capacitor pattern. This arrangement allows the dummy pattern to be formed by the same process used in fabricating the memory cells with large process margin.

The semiconductor chip 200 having the dummy patterns near the boundary can effectively prevent dislocation from expanding into the bulk-device region from the boundary, in addition to those advantages of reduction of stress, level uniformity of the device-fabrication surfaces, and prevention of increase in chip size.

<Other Embodiments>

In the first through fifth embodiments, the bulk growth layer is formed by selective epitaxial growth of single crystal silicon. However, the bulk growth layer may be formed of silicon germanium (SiGe) using epitaxial growth. Furthermore, the bulk growth layer may be formed by non-selective epitaxial growth.

The semiconductor chip may include two or more different types of bulk device regions. For example, a silicon bulk growth layer and a silicon germanium bulk growth layer may be arranged in an SOI substrate. In this case, it is desirable that the boundary between the SOI deice region and each of the bulk device region, or between the bulk device regions, is filled with a gate electrode material, such as polysilicon, SiGe, or other silicon-based compound semiconductor, used for the devices fabricated in the associated bulk device region. This arrangement can reduce stress and increase the design margin.

The endmost isolation positioned closest to the boundary between the SOI device region and the silicon or SiGe bulk device region may function as the boundary layer. This arrangement can reduce dead space in the chip.

For example, the semiconductor chip may have a DRAM macro in the silicon bulk region, a bipolar circuit in the SiGe bulk device region, and a logic circuit in the SOI device, which are all mounted on a single chip. The isolations in the respective bulk device regions and the SOI device region can be optimized, depending on the characteristics of the devices or the functional block formed in these regions, as illustrated in the third through fifth embodiments. Optimization of the isolations realizes a high-performance system LSI Dummy patterns deeper than the buried oxide of the SOI substrate may be arranged in both the silicon bulk device region and the SiGe bulk device region along the boundary in order to prevent dislocation, which is likely to occur at the boundary, from expanding into the bulk device regions. The dummy pattern may be a dummy trench having the same structure as a trench capacitor when the bulk device region includes trench capacitors. Alternatively, if the bulk device region includes vertical bipolar transistors, the dummy pattern may be a deep trench having the same structure as the deep isolation for separating the collector of the bipolar transistor. The buried insulator of the SOI substrate is not limited to a buried oxide.

All the embodiments imply various modifications and substitutions possible by adjusting the etching conditions of trench isolations. For example, in the second embodiment shown in FIG. 4, the isolations 65a, 65b, and 65c are formed in both the bulk device region and the SOI device region at the same time by setting an etching condition where silicon and dioxide are etched at the same etching rate. However, if an etching condition where the etching rate with respect to dioxide is slower than that for silicon is selected, the second isolation 65b in the SOI device region 12 becomes shallower than the first isolation 65a in the bulk device region 13. To be more precise, the isolation 65c located at the boundary becomes asymmetric. In other words, a part of the isolation 65c positioned on the buried oxide 52 is of the same depth as the second isolation 65b in the SOI device region 13, and the other part of the isolation 65c is as deep as the first isolation 65a in the bulk device region 11. It is preferable for the isolations 65a and 65c to be deeper than the interface between the base substrate 51 and the buried oxide 52 for the purpose of completely removing the damaged portion of the bulk growth layer near the boundary due to the adverse influence of the sidewall protection film or crystal defect.

The isolations 65a, 65c positioned in the bulk device region 11 may be fabricated in a separate process from the Fabrication process for the isolation 65b in the SOI device region 12. For example, the isolations 65a and 65c are fabricated together under the etching condition where silicon and dioxide are etched at the same etching rate, and the isolation 65b is formed under a different condition where the etching rate with respect to dioxide is slower than that for silicon In such a case, the boundary isolation 65c becomes asymmetric, and the isolation 65b in the SOI device region 12 is optimized. The shallow trench of the isolation 65b is easily and precisely filled with an insulator, allowing miniaturized isolation patterns of the logic circuit.

Furthermore, the uniformity of the device-fabrication surfaces over the bulk device region and the SOI device region can prevent adverse effect on subsequent processes. An appropriate boundary layer reduces undesirable stress and the resultant crystal defect at the boundary between the bulk device region and the SOI device region. The improved layout arrangement of the isolations located on and near the boundary can prevent an increase in chip size.

What is claimed is:

1. A method for fabricating a semiconductor chip comprising:
    preparing an SOI substrate consisting of a base substrate, a buried insulator on the base substrate, and a silicon layer on the insulator;
    selectively removing the silicon layer and the buried insulator in a predetermined area of the SOI substrate so as to form a groove at an upper portion of the buried insulator;
    forming a sidewall protection film covering a side face of the silicon layer revealed by the removal and a side face of the groove;
    exposing a portion of the base substrate by selectively removing the buried insulator from the bottom of the groove;
    forming a bulk growth layer from the exposed surface of the base substrate until the top face of the bulk growth layer is in alignment with the top face of the silicon layer;
    forming isolations having the same depth in the bulk growth layer and in the SOI substrate in a same process; and
    fabricating devices in the bulk growth layer and the silicon layer on the buried insulator.

2. The method according to claim 1, further comprising:
    removing the sidewall protection film after the formation of the bulk growth layer, wherein the fabrication of devices includes forming a gate and filling a recess resulting from the removal of the sidewall protection film with a semiconductor gate material.

3. The method according to claim 1, wherein the formation of isolations includes providing isolation at the boundary between the bulk growth layer and the SOI substrate, while removing the sidewall protection film.

4. The method according to claim 3, wherein the isolations are deeper than the buried insulator.

5. The method according to claim 1, wherein the isolations are deeper than the buried insulator.

6. A method for fabricating a semiconductor chip comprising:
    preparing an SOI substrate consisting of a base substrate, a buried insulator on the base substrate, and a silicon layer on the insulator;
    removing the silicon layer at a first position of the SOI substrate to form a first isolation in the removed portion, a side face of the silicon layer being covered with the first isolation;
    exposing a top face of the base substrate at a second position, while keeping the side face of the silicon layer covered with the first isolation;
    forming a bulk growth layer from the exposed surface of the base substrate until the top face of the bulk growth layer is in alignment with the top face of the silicon layer;
    forming a second isolation in the bulk growth layer, the second isolation being deeper than the first isolation; and
    fabricating devices in the bulk growth layer and the silicon layer on the buried insulator.

7. The method according to claim 6, wherein the formation of the first isolation includes providing an isolation at a position that is to be a boundary between the bulk growth layer and the SOI substrate.

8. The method according to claim 6, wherein the formation of the first isolation includes providing an isolation to the second position at which the base substrate is to be exposed.

9. The method according to claim 6, further comprising:
forming a first part of a trench capacitor in the exposed surface of the base substrate before the bulk growth layer is formed, the first part having a first width; and
forming a second part of the trench capacitor in the bulk growth layer, the second part being connected to the first part and having a second width narrower than that of the first part.

10. A method for fabricating a semiconductor chip comprising:
preparing an SOI substrate consisting of a base substrate, a buried insulator on the base substrate, and a silicon layer on the insulator;
removing the silicon layer and the buried insulator in a predetermined area of the SOI substrate to expose the base substrate;
forming a first part of a trench capacitor in the exposed based substrate, the first part having a first width;
after forming the first part, forming a bulk growth layer on the exposed base substrate until the top face of the bulk growth layer is in alignment with the top face of the silicon layer on the buried insulator; and
forming a second part of the trench capacitor connected to the first part and having a second width narrower than the first width.

11. The method according to claim 10, further comprising:
forming isolations in the bulk growth layer and in the SOI substrate in the same process.

12. A method for fabricating a semiconductor chip comprising:
preparing an SOI substrate consisting of a base substrate, a buried insulator on the base substrate, and a silicon layer on the insulator;
removing the silicon layer and the buried insulator in a predetermined area of the SOI substrate to expose the base substrate;
forming a bulk growth layer on the exposed base substrate until the top face of the bulk growth layer in alignment with the top face of the silicon layer on the buried insulator;
forming a dummy pattern in the bulk growth layer, the dummy pattern being deeper than the buried insulator so as to prevent dislocation from expanding into the bulk growth layer from the boundary between the bulk growth layer and the SOI substrate; and
fabricating devices in the bulk growth layer on the opposite side of the boundary between the bulk growth layer and the SOI substrate in relation to the dummy pattern and in the SOI substrate.

13. The method according to claim 12, wherein the formation of the dummy pattern includes forming a trench capacitor in the bulk growth layer in the same process as for forming the dummy pattern.

* * * * *